United States Patent
Yeh

(10) Patent No.: US 7,072,220 B1
(45) Date of Patent: *Jul. 4, 2006

(54) METHOD AND APPARATUS FOR OPERATING A NON-VOLATILE MEMORY ARRAY

(75) Inventor: Chih Chieh Yeh, Jhongshan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 11/024,075

(22) Filed: Dec. 28, 2004

(51) Int. Cl.
G11C 16/04 (2006.01)

(52) U.S. Cl. .................. 365/185.18; 365/185.27; 365/185.17

(58) Field of Classification Search .......... 365/185.18, 365/185.27, 185.33, 185.17, 185.21, 185.03; 257/341
See application file for complete search history.

(56) References Cited

U.S. PATENT DOCUMENTS

| | | | |
|---|---|---|---|
| 4,939,690 A | 7/1990 | Momodomi et al. | |
| 5,600,593 A * | 2/1997 | Fong | 365/185.19 |
| 5,701,023 A * | 12/1997 | Bulucea et al. | 257/341 |
| 5,768,192 A | 6/1998 | Eitan | |
| 5,814,853 A | 9/1998 | Chen | |
| 5,936,887 A | 8/1999 | Choi et al. | |
| 6,144,586 A * | 11/2000 | Van Houdt et al. | 365/185.29 |
| 6,160,286 A | 12/2000 | Chi | |
| 6,172,907 B1 | 1/2001 | Jenne | |
| 6,403,405 B1 * | 6/2002 | Kawanaka et al. | 438/151 |
| 6,493,265 B1 * | 12/2002 | Satoh et al. | 365/185.21 |
| 6,657,894 B1 | 12/2003 | Yeh et al. | |
| 6,690,601 B1 | 2/2004 | Yeh et al. | |
| 2005/0224878 A1* | 10/2005 | Chang | 257/347 |

* cited by examiner

Primary Examiner—Tuan T. Nguyen
Assistant Examiner—Dang Nguyen
(74) Attorney, Agent, or Firm—Kenta Suzue; Haynes Beffel & Wolfeld LLP

(57) ABSTRACT

A string of memory cells with a charge trapping structure coupled in series is read, by measuring current that flows between the body region of the selected memory cell and the contact region of the selected memory cell. The charge storage state of the charge trapping structure affects the measured current.

50 Claims, 21 Drawing Sheets

METHOD AND APPARATUS FOR OPERATING A NON-VOLATILE MEMORY ARRAY

RELATED APPLICATIONS

This application is related to co-pending U.S. application Ser. No. 11/024,339 filed on 28 Dec. 2004 application entitled METHOD AND APPARATUS FOR OPERATING A NON-VOLATILE MEMORY DEVICE, and to co-pending U.S. application Ser. No. 11/023,747 filed on 28 Dec. 2004 the same date entitled METHOD AND APPARATUS FOR OPERATING A NON-VOLATILE MEMORY ARRAY.

BACKGROUND OF THE INVENTION

1. Field of the Invention

The present invention relates to electrically programmable and erasable non-volatile memory, and more particularly to charge trapping memory that reads the contents of the charge trapping structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry name PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Conventional memory cell structures rely on the reverse read operation to determine the contents of the memory structure. However, the reverse read technique effectively couples together multiple locations of the charge trapping structure, even when only portion of the charge trapping structure contains data of interest. This dependence constrains the difficulty of using the charge trapping structure as nonvolatile memory, by narrowing the sensing window of currents measured from the reverse read technique.

Thus, a need exists for a charge trapping memory cell that can be read without suffering substantial coupling between multiple locations of the charge trapping structure.

SUMMARY OF THE INVENTION

A method of operating a memory cell, an architecture for an integrated circuit including such a memory cell, and a method of manufacturing such memory, are provided.

A nonvolatile memory according to the described technology comprises memory cells arranged in row and columns, bit lines, word lines providing gate voltage to memory cells and coupled to the top dielectrics of memory cells, and logic coupled to the memory cells. Each column has memory cells arranged in a series from a contact, each column is coupled to a corresponding bit line at the contact. Each memory cell in a column includes a body region, a contact region that is electrically coupled to the corresponding bit line of the column, a bottom dielectric coupled to the body region, a charge trapping structure, and a top dielectric coupled to the charge trapping structure. The charge trapping structure has a charge storage state, which stores one bit or multiple bits, depending on the application and design of the memory cell.

The logic applies a bias arrangement to the bit lines and the word lines to determine the charge storage stage of selected memory cells. Selected memory cells are memory cells in the array which are selected to be read. The logic measures current flowing in response to the applied bias arrangement, to determine the charge storage stage of selected memory cells. The measured current flows between the body region of the selected memory cell and the contact region of the selected memory cell.

The bias arrangement applied by the logic causes a first voltage difference between the gate the contact region, and a second voltage difference between the body region and the contact region. The first voltage difference and the second voltage difference cause sufficient band-to-band tunneling current for the current measurement. However, the first voltage difference and the second voltage differences fail to change the charge storage state. Thus, the read operation is not destructive of the data stored in the charge trapping structure. In some embodiments the first voltage difference is at least about 5 V between the gate and the contact region, and the second voltage difference is less than about 5 V between the body region and the contact region.

The voltage difference between the gate and the contact region creates an electric field which causes band bending in the contact region. The degree of band bending is affected by the charge storage state of the charge trapping structure, resulting in a band-to-band tunneling current in the contact region that varies with the charge storage state.

In some embodiments, the body region is a well in a semiconductor substrate. In other embodiments, the body region is simply the semiconductor substrate.

In some embodiments, the logic applies a second bias arrangement to adjust the charge storage state by increasing a net positive charge in the charge trapping structure, and applies a third bias arrangement to adjust the charge storage state by increasing a net negative charge in the charge trapping structure. In some embodiments, the second bias arrangement corresponds to programming and the third bias arrangement corresponds to erasing, and in other embodiments the second bias arrangement corresponds to erasing and the third bias arrangement correspond to programming. As generally used herein, programming refers to adding limited amounts of charge in the charge trapping structure, such as by the addition of holes or electrons to the charge trapping structure. Also as generally used herein, erasing refers to resetting the charge storage state of the charge trapping structure, such as by adding a single charge type throughout the charge trapping structure until equilibrium is reached. The invention encompasses both products and methods where programming refers to making the net charge stored in the charge trapping structure more negative or more positive, and products and methods where erasing refers to making the net charge stored in the charge trapping structure more negative or more positive.

Net positive charge is increased in the charge trapping structure via current mechanisms such as band-to-band hot hole tunneling, for example from the gate, contact region, or body region. Net negative charge is increased in the charge trapping structure via current mechanisms such as electron tunneling, Fowler-Nordheim tunneling, channel hot electron injection current, and channel initiated secondary electron injection current, for example from the gate, contact region, or body region. In some embodiments, the measured current is at least about 10 times greater for the charge storage state adjusted by one of the second bias arrangement and the third bias arrangement than the measured current for the charge storage state adjusted by the other of the second bias arrangement and the third bias arrangement, for example about 100 nA for one measurement and about 1 nA for the other measurement.

Other embodiments of the technology described above include a method for operating a memory cell, and a method of manufacturing nonvolatile memory according to the described technology.

Other aspects and advantages of the technology presented herein can be understood with reference to the figures, the detailed description and the claims, which follow.

DETAILED DESCRIPTION

Figure 1A:
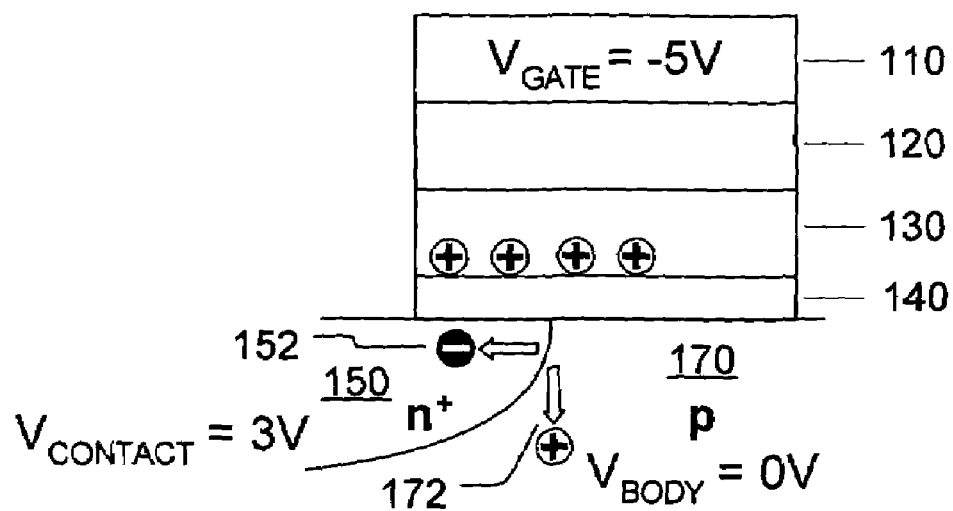
FIG. 1A is a simplified diagram of a charge trapping memory cell, showing a read operation with a negative voltage on the gate being performed on a charge trapping structure with a charge storage state having relatively more net positive charge than FIG. 1B. The memory cell has an n-type contact region.
Figure 1B:
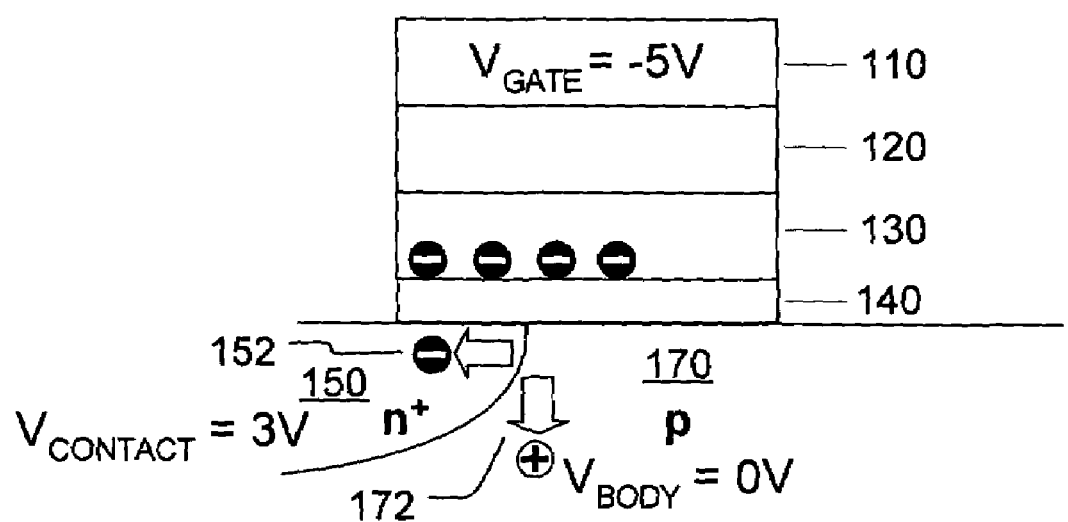
FIG. 1B is a simplified diagram of a charge trapping memory cell, showing a read operation with a negative voltage on the gate being performed on a charge trapping structure with a charge storage state having relatively more net negative charge than FIG. 1A. The memory cell has an n-type contact region.

FIG. 1A and FIG. 1B are simplified diagrams of a charge trapping memory cell, showing a read operation with a negative voltage on the gate being performed on a charge trapping structure. In FIG. 1A, the charge trapping structure has a charge storage state with relatively more net positive charge than in FIG. 1B. The charge trapping memory cell of FIG. 1A and FIG. 1B has a p-doped body region 170 and an n+-doped contact region 150. The remainder of the memory cell includes a bottom dielectric structure 140 (bottom oxide) on the body region 170, a charge trapping structure 130 on the bottom dielectric structure 140, a top dielectric structure 120 (top oxide) on the charge trapping structure 130, and a gate 110 on the oxide structure 120. Representative top dielectrics include silicon dioxide and silicon oxynitride having a thickness of about 5 to 10 nanometers, or other similar high dielectric constant materials, for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In older memory cells, the material of a floating gate is an equipotential or nearly equipotential structure, such as highly doped polysilicon. Thus, charge that is added to the floating gate will tend to spread out evenly throughout the floating gate. If charge is added to the floating gate with the goal of raising the charge density of one portion of the floating gate, then because of the equipotential nature of the floating gate, typically sufficient charge must be added to the floating gate until the charge density of the entire floating gate is raised.

In contrast with a floating gate, a charge trapping structure may be approximated as neither an equipotential nor nearly equipotential structure. When charge is added to the charge trapping structure, the added charge remains local to a portion of the charge trapping structure, rather than automatically spreading evenly throughout the charge trapping structure. Thus, when charge is added to the charge trapping structure with the goal of raising the charge density of one portion of the floating gate, the charge density of part of the charge trapping structure rises, while the charge density of the remainder of the charge trapping structure remains relatively unchanged. The requirement of the amount of added charge is much less for the charge trapping structure than for a comparable floating gate.

In the diagram of FIG. 1A, the charge trapping structure 130 of the memory cell has been programmed, for example via band-to-band hole injection into the charge trapping structure 130. Prior to programming, the charge trapping structure 130 of the memory cell has been erased, for example via a channel reset operation injecting electrons via Fowler-Nordheim tunneling from the gate 110 to the charge trapping structure 130 and from the charge trapping structure 130 to the body region 170.

In the bias arrangement of FIG. 1A for reading the charge trapping structure 130, the voltage of the gate 110 is −5 V, the voltage of the contact region 150 is 3 V, and the voltage of the body region 170 is 0 V. The memory cell of FIG. 1B is similar to memory cell of FIG. 1A, except that a read operation is being performed on a charge trapping structure with higher net negative charge in the charge trapping structure 130. In the bias arrangement of FIG. 1B for reading the charge trapping structure 130, the voltage of the gate 110 is −5 V, the voltage of the contact region 150 is 3 V, and the voltage of the body region 170 is 0 V. In FIGS. 1A and 1B, the bias arrangement is determined among the various terminals, such that the energy bands bend sufficiently to cause band-to-band current in the n+ doped contact region 150.

In this bias arrangements of FIGS. 1A and 1B, the area of the junction between the p-doped body region 170 and the n+-doped contact region 150 displays the behavior of a reverse biased p-n junction. However, the gate voltage causes the energy bands to bend sufficiently such that band-to-band tunneling occurs in the n+-doped contact region 150. The high doping concentration in the source 150, the resulting high charge density of the space charge region, and the accompanying short length of the space charge region over which the voltage changes, contribute to the sharp energy band bending. Electrons in the valence band tunnel through the forbidden gap to the conduction band and drift down the potential hill, deeper into the n+-doped source 150. Similarly, holes drift up the potential hill, away from the n+-doped contact region 150, and toward the p-doped body region 170.

The voltage of the gate 110 controls the voltage of the portion of the body region 170 by the bottom dielectric structure 140 (bottom oxide). In turn, the voltage of the portion of the body region 170 by the bottom dielectric structure 140 (bottom oxide) controls the degree of band bending between the body region 170, and the n+-doped contact region 150. As the voltage of the gate 110 becomes more negative, the voltage of the portion of the body region 170 by the bottom dielectric structure 140 (bottom oxide) becomes more negative, resulting in deeper band bending in the n+-doped contact region 150. More band-to-band current flows, as a result of at least some combination of 1) an increasing overlap between occupied electron energy levels on one side of the bending energy bands, and unoccupied electron energy levels on the other side of the bending energy bands, and 2) a narrower barrier width between the occupied electron energy levels and the unoccupied electron energy levels (Sze, *Physics of Semiconductor Devices*, 1981).

As mentioned above, in FIG. 1A the charge trapping structure 130 has relatively higher net positive charge, for example by being programmed and occupied by holes, whereas in FIG. 1B the charge trapping structure 130 has relatively higher net negative charge, for example by being erased and occupied with electrons. As a result, in accordance with Gauss's Law, when −5 V is applied to the gate 110, the bottom dielectric structure 140 (bottom oxide) and the portion of the body region 170 by the bottom dielectric structure 140 is biased more negatively in FIG. 1B than FIG. 1A. Thus, deeper band bending occurs between the contact region 150 and the body region 170 in FIG. 1B than FIG. 1A, and more band band-to-band current flows between the contact region 150 and the body region 170 in the bias arrangement shown in FIG. 1A for reading the charge trapping structure 130, than flows between the contact region 150 and the body region 170 in the bias arrangement shown in FIG. 1B for reading the charge trapping structure 130.

Figure 1C:
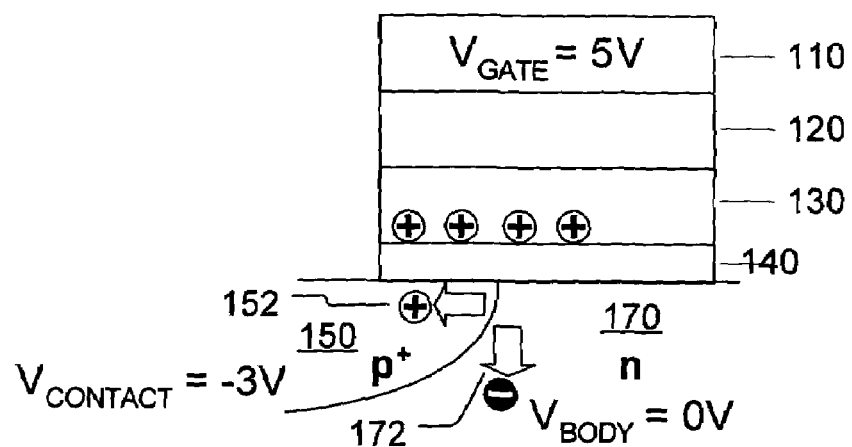
FIG. 1C is a simplified diagram of a charge trapping memory cell, showing a read operation with a positive voltage on the gate being performed on a charge trapping structure with a charge storage state having relatively more net positive charge than FIG. 1D. The memory cell has a p-type contact region.
Figure 1D:
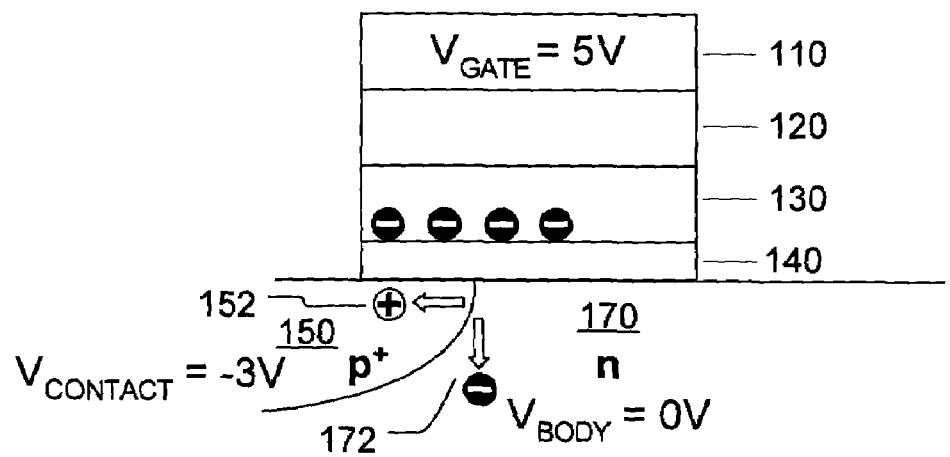
FIG. 1D is a simplified diagram of a charge trapping memory cell, showing a read operation with a positive voltage on the gate being performed on a charge trapping structure with a charge storage state having relatively more net negative charge than FIG. 1C. The memory cell has a p-type contact region.
Figure 1E:
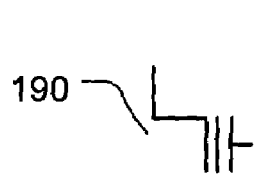
FIG. 1E shows the circuit symbol for a charge trapping memory cell with a single contact region.
Figure 1F:
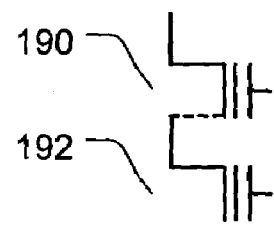
FIG. 1F shows the circuit symbol for two charge trapping memory cells each with a single contact region coupled in series.

FIG. 1C and FIG. 1D are simplified diagrams of a charge trapping memory cell, showing a read operation with a positive voltage on the gate being performed on a charge trapping structure. The charge trapping memory cell of FIG. 1C and FIG. 1D has an n-doped body region 170 and a p+-doped contact region 150, unlike the charge trapping memory cell of FIG. 1A and FIG. 1B that has a p-doped body region 170 and an n+-doped contact region 150.

In FIG. 1C, the charge trapping structure has a charge storage state with relatively more net positive charge than in FIG. 1D. In the bias arrangement of FIG. 1C for reading the charge trapping structure 130, the voltage of the gate 110 is 5 V, the voltage of the contact region 150 is −3 V, and the voltage of the body region 170 is 0V. The memory cell of FIG. 1D is similar to memory cell of FIG. 1C, except that a read operation is being performed on a charge trapping structure with higher net negative charge in the charge trapping structure 130. In the bias arrangement of FIG. 1D for reading the charge trapping structure 130, the voltage of the gate 110 is 5 V, the voltage of the contact region 150 is −3 V, and the voltage of the body region 170 is 0V. In FIGS. 1C and 1D, the bias arrangement is determined among the various terminals, such that the energy bands bend sufficiently to cause band-to-band current in the p+-doped contact region 150.

The bottom dielectric structure 140 (bottom oxide) and the portion of the body region 170 by the bottom dielectric structure 140 is biased more positively in FIG. 1C than FIG. 1D. Thus, deeper band bending occurs between the contact region 150 and the body region 170 in FIG. 1C than FIG. 1D, and more band band-to-band current flows between the contact region 150 and the body region 170 in the bias arrangement shown in FIG. 1C for reading the charge trapping structure 130, than flows between the contact region 150 and the body region 170 in the bias arrangement shown in FIG. 1D for reading the charge trapping structure 130.

The difference in the bias arrangements of FIGS. 1A and 1B for reading, and the bias arrangements of FIGS. 2A, 2D, 3A, and 3D for programming, show a careful balance. For reading, the potential difference between the contact region and the body region should not cause a substantial number of carriers to transit the tunnel oxide and affect the charge storage state of the charge storage structure. In contrast, for programming, the potential difference between the contact region and the body region is sufficient to cause a substantial number of carriers to transit the tunnel oxide and affect the charge storage state of the charge storage structure.

FIGS. 2A–2F and are simplified diagrams of a memory cell that show program and erase operations being performed on the memory cell, primarily with holes.

Figure 2A:
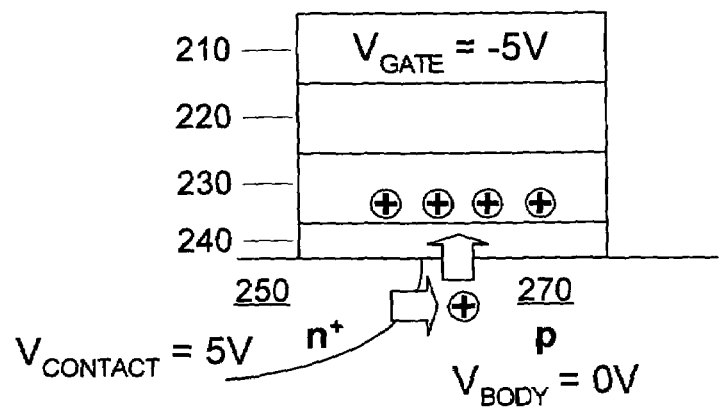
FIG. 2A is a simplified diagram of a charge trapping memory cell with an n-type contact region, showing a program operation being performed that increases net positive charge in the charge trapping structure with holes from the contact region.
Figure 2B:
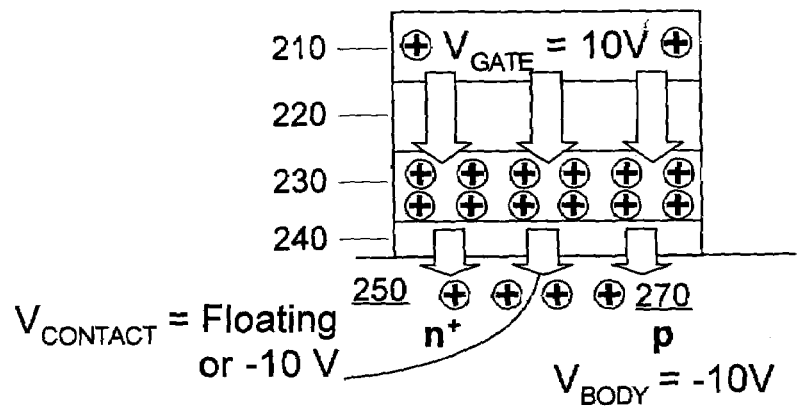
FIG. 2B is a simplified diagram of a charge trapping memory cell with an n-type contact region, showing an erase operation being performed on the charge trapping structure, with holes moving in the general direction from the gate to the contact and body regions.
Figure 2C:
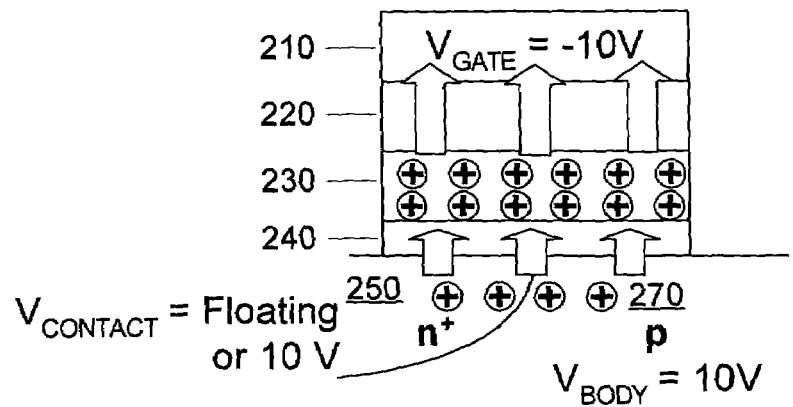
FIG. 2C is a simplified diagram of a charge trapping memory cell with an n-type contact region, showing another erase operation being performed on the charge trapping structure, with holes moving in the general direction to the gate from the contact and body regions.

In FIG. 2A, programming is accomplished using band-to-band tunneling induced hot hole injection, and in FIGS. 2B and 2C, erasing is accomplished using the E-field induced hole tunneling (also known as Fowler-Nordheim tunneling) which causes tunneling current between the gate and the charge trapping structure, and between the body region and the charge trapping structure. The memory cell of FIGS. 2A–2C has an n-type contact region and a p-type body region.

Thus, as illustrated in FIG. 2A, the charge trapping structure 230 is programmed by applying −5 V to the gate 210, 5 V to the contact region 250, and 0 V to the body region 270. This induces hot holes having sufficient energy to jump over the tunnel dielectric 240 into the charge trapping structure 230. FIG. 2B illustrates E-field assisted hole tunneling in the general direction from the gate 210 to the body region 270 and the contact region 250, induced by a relatively high positive bias on the gate 210 of 10 V and a relatively high negative bias of −10 V on the contact region 250 and body region 270. FIG. 2C illustrates E-field assisted hole tunneling in the general direction to the gate 210 from the body region 270 and the contact region 250, induced by a relatively high negative bias on the gate 210 of −10 V and a relatively high positive bias of 10 V on the contact region 250 and body region 270.

Figure 2D:
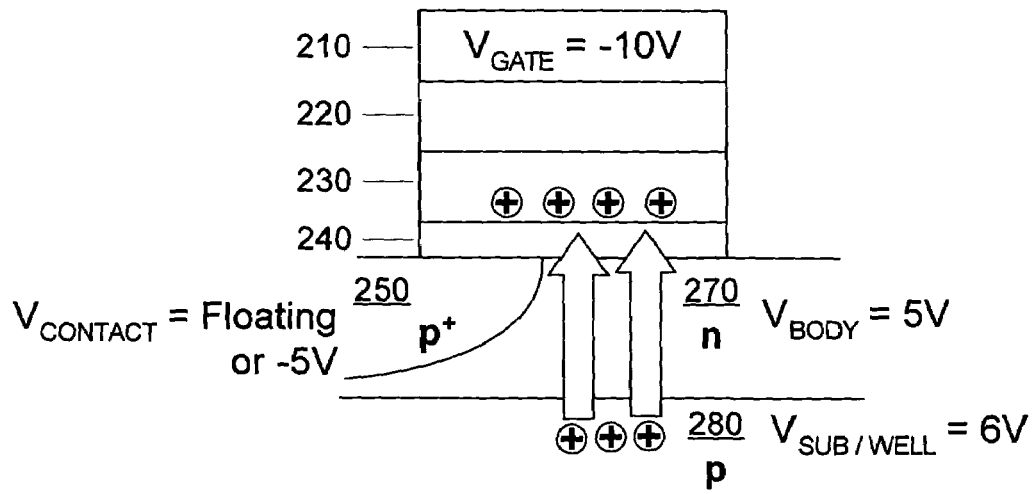
FIG. 2D is a simplified diagram of a charge trapping memory cell with a p-type contact region, showing a program operation being performed that increases net positive charge in the charge trapping structure with holes from a p-type substrate or well moving across an n-type body region.
Figure 2E:
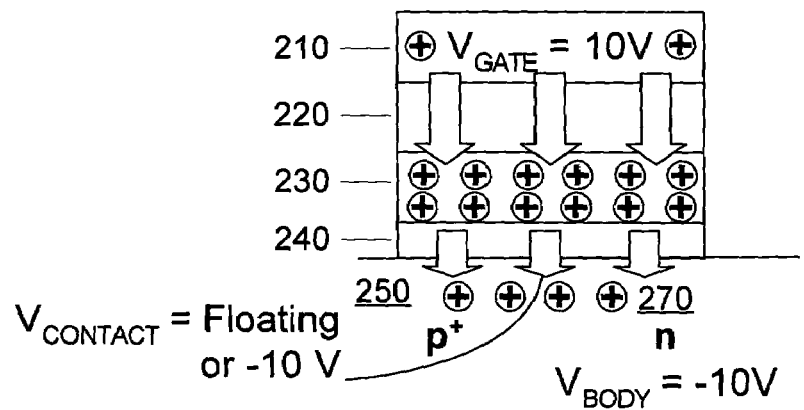
FIG. 2E is a simplified diagram of a charge trapping memory cell with a p-type contact region, showing an erase operation being performed on the charge trapping structure, with holes moving in the general direction from the gate to the contact and body regions.
Figure 2F:
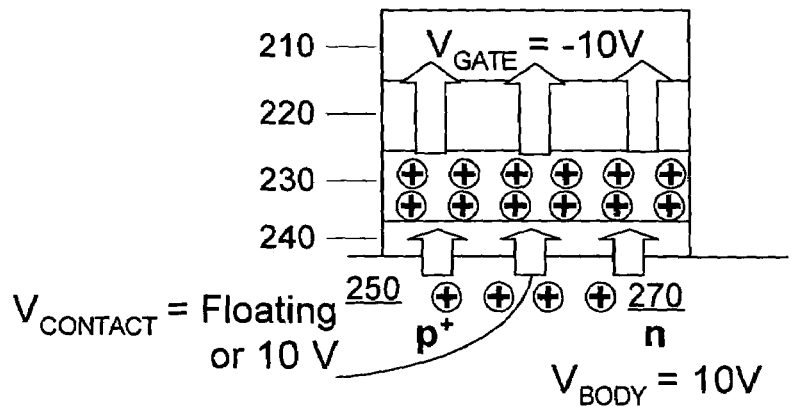
FIG. 2F is a simplified diagram of a charge trapping memory cell with a p-type contact region, showing another erase operation being performed on the charge trapping structure, with holes moving in the general direction to the gate from the contact and body regions.

The memory cell of FIGS. 2D–2F has a p-type contact region 250 and an n-type body region 270. In FIG. 2D a programming operation increases net positive charge in the charge trapping structure with holes from a p-type substrate or well 280. This programming operation injects minority carrier holes across the n-type body region 270 by applying 6 V to the substrate or well 280, 5 V to the body region 270, −5 V to the contact region 250, and −10 V to the gate 210. FIG. 2D illustrates E-field assisted hole tunneling in the general direction from the gate 210 to the body region 270 and the contact region 250, induced by a relatively high positive bias on the gate 210 of 10 V and a relatively high negative bias of −10 V on the contact region 250 and body region 270. FIG. 2F illustrates E-field assisted hole tunneling in the general direction to the gate 210 from the body region 270 and the contact region 250, induced by a relatively high negative bias on the gate 210 of −10 V and a relatively high positive bias of 10 V on the contact region 250 and body region 270. In FIGS. 2A–2F, the voltage of the contact region can also be floating.

Other program and erase techniques can be used in operation algorithms applied to the PHINES type memory cell, as described for example in U.S. Pat. No. 6,690,601. Other memory cells and other operation algorithms might also be used.

Figure 3A:
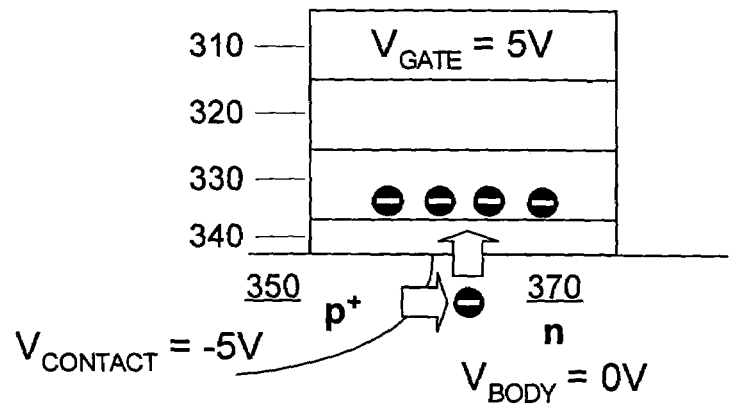
FIG. 3A is a simplified diagram of a charge trapping memory cell with a p-type contact region, showing a program operation being performed that increases net negative charge in the charge trapping structure with electrons from the contact region.

FIGS. 3A–3F and are simplified diagrams of a memory cell that show program and erase operations being performed on the memory cell, primarily with electrons. In FIG. 3A, programming is accomplished using band-to-band tunneling induced hot electron injection, and in FIGS. 3B and 3C, erasing is accomplished using the E-field induced electron tunneling (also known as Fowler-Nordheim tunneling) which causes tunneling current between the gate and the charge trapping structure, and between the body region and the charge trapping structure. The memory cell of FIGS. 3A–3C has a p-type contact region and an n-type body region.

Figure 3B:
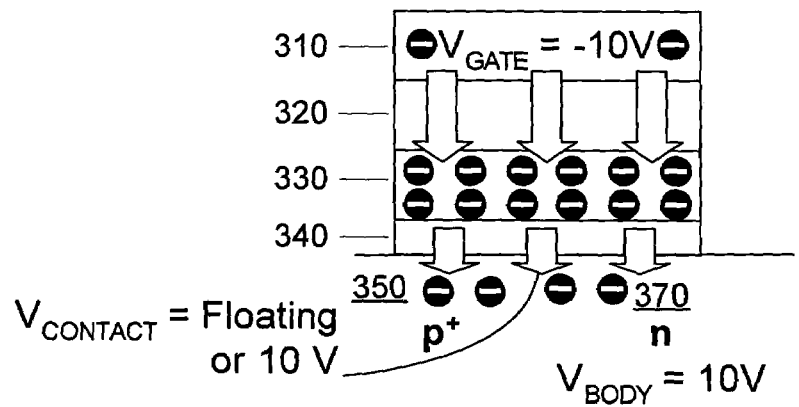
FIG. 3B is a simplified diagram of a charge trapping memory cell with a p-type contact region, showing an erase operation being performed on the charge trapping structure, with electrons moving in the general direction from the gate to the contact and body regions.
Figure 3C:
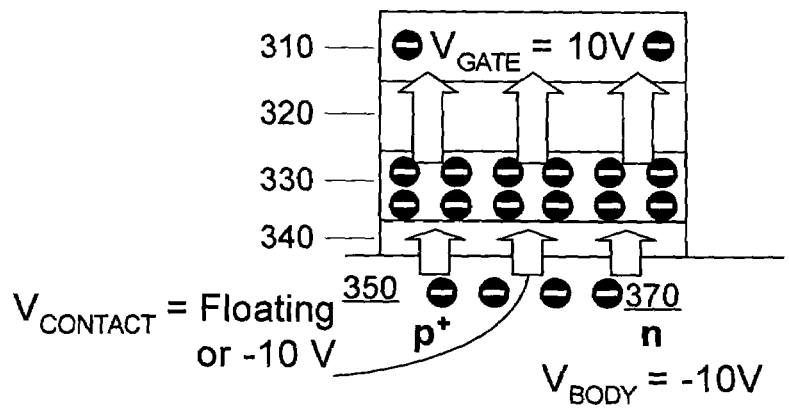
FIG. 3C is a simplified diagram of a charge trapping memory cell with a p-type contact region, showing another erase operation being performed on the charge trapping structure, with electrons moving in the general direction to the gate from the contact and body regions.

Thus, as illustrated in FIG. 3A, the charge trapping structure 330 is programmed by applying 5 V to the gate 310, −5 V to the contact region 350, and 0 V to the body region 370. This induces hot electrons having sufficient energy to jump over the tunnel dielectric 340 into the charge trapping structure 330. FIG. 3B illustrates E-field assisted electron tunneling in the general direction from the gate 310 to the body region 370 and the contact region 350, induced by a relatively high negative bias on the gate 310 of −10 V and a relatively high positive bias of 10 V on the contact region 350 and body region 370. FIG. 3C illustrates E-field assisted electron tunneling in the general direction to the gate 310 from the body region 370 and the contact region 350, induced by a relatively high positive bias on the gate 310 of 10 V and a relatively high negative bias of −10 V on the contact region 350 and body region 370.

Figure 3D:
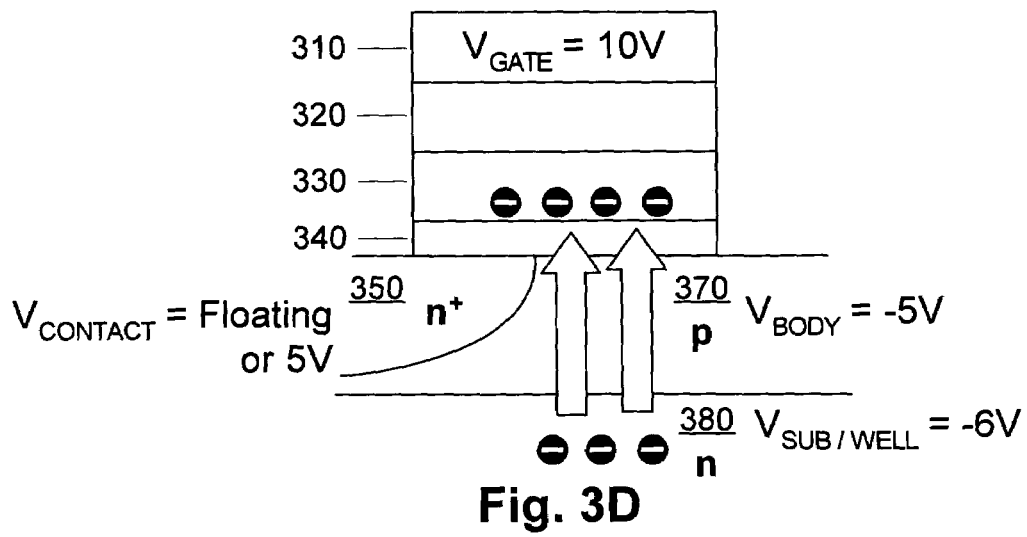
FIG. 3D is a simplified diagram of a charge trapping memory cell with an n-type contact region, showing a program operation being performed that increases net negative charge in the charge trapping structure with electrons from an n-type substrate or well moving across a p-type body region.
Figure 3E:
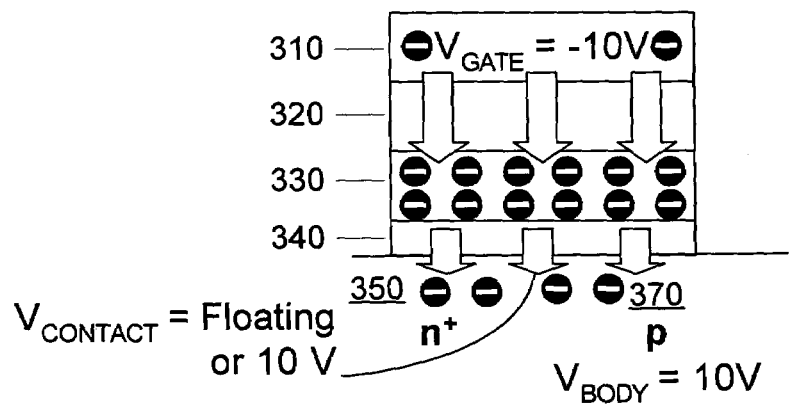
FIG. 3E is a simplified diagram of a charge trapping memory cell with an n-type contact region, showing an erase operation being performed on the charge trapping structure, with electrons moving in the general direction from the gate to the contact and body regions.
Figure 3F:
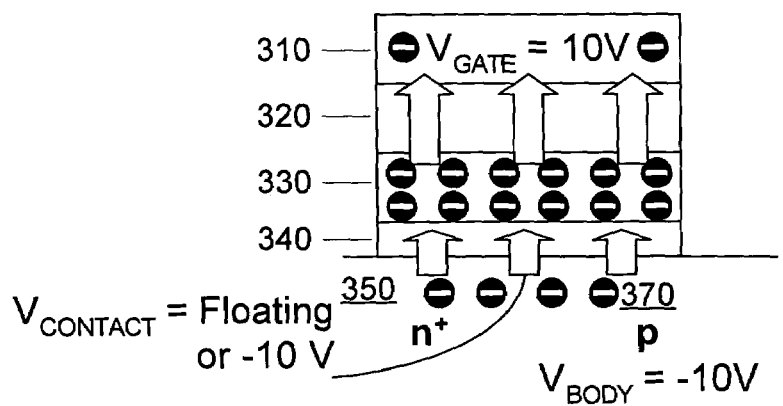
FIG. 3F is a simplified diagram of a charge trapping memory cell with an n-type contact region, showing another erase operation being performed on the charge trapping structure, with electrons moving in the general direction to the gate from the contact and body regions.

The memory cell of FIGS. 3D–3F has an n-type contact region 350 and a p-type body region 370. In FIG. 3D a programming operation increases net negative charge in the charge trapping structure with electrons from an n-type substrate or well 380. This programming operation injects minority carrier electrons across the p-type body region 370 by applying −6 V to the substrate or well 380, −5 V to the body region 370, 5V to the contact region 350, and 10 V to the gate 310. FIG. 3D illustrates E-field assisted electron tunneling in the general direction from the gate 310 to the body region 370 and the contact region 350, induced by a relatively high negative bias on the gate 310 of −10 V and a relatively high positive bias of 10 V on the contact region 350 and body region 370. FIG. 3F illustrates E-field assisted electron tunneling in the general direction to the gate 310 from the body region 370 and the contact region 350, induced by a relatively high positive bias on the gate 310 of 10 V and a relatively high negative bias of −10 V on the contact region 350 and body region 370. In FIGS. 3A–3F, the voltage of the contact region can also be floating.

Figure 4A:
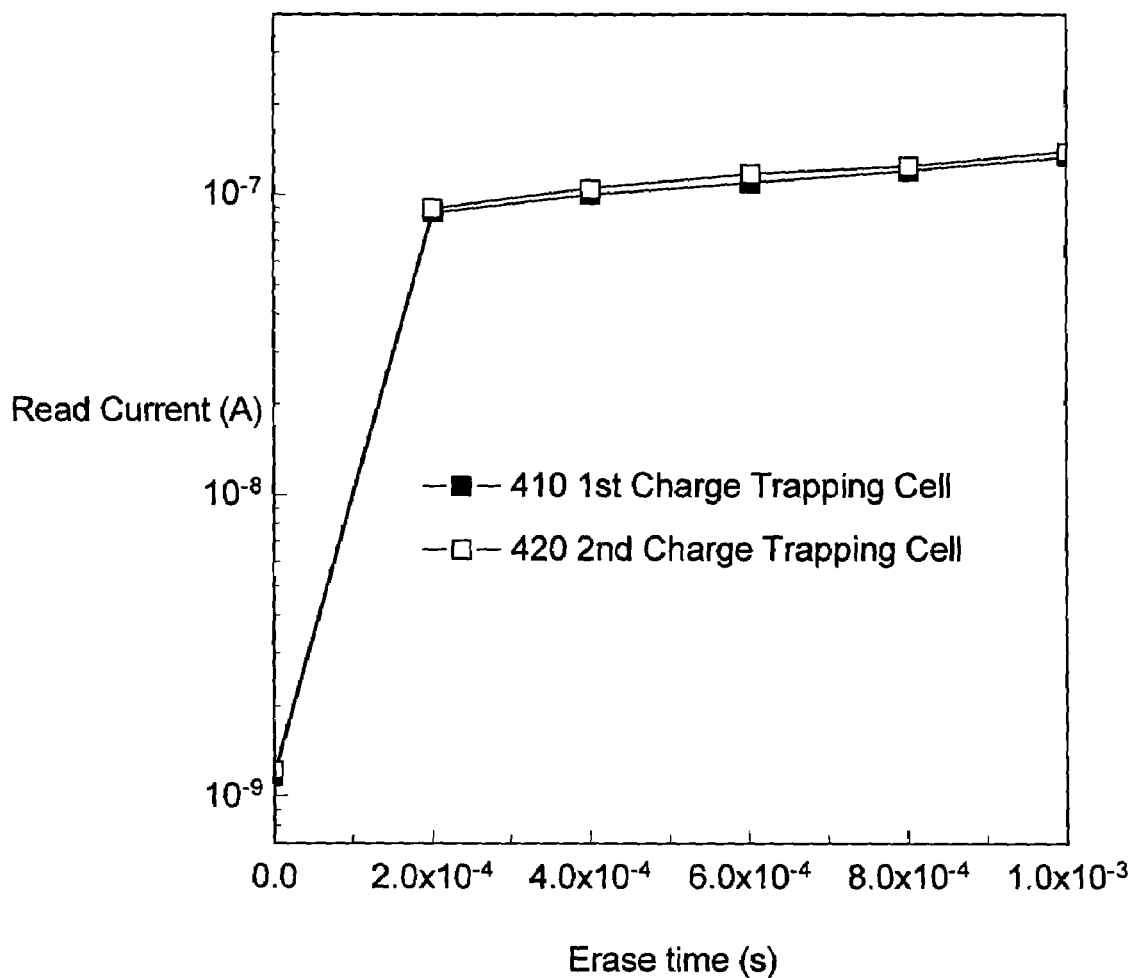
FIG. 4A is a graph showing an erase operation being performed on different memory cells.
Figure 4B:
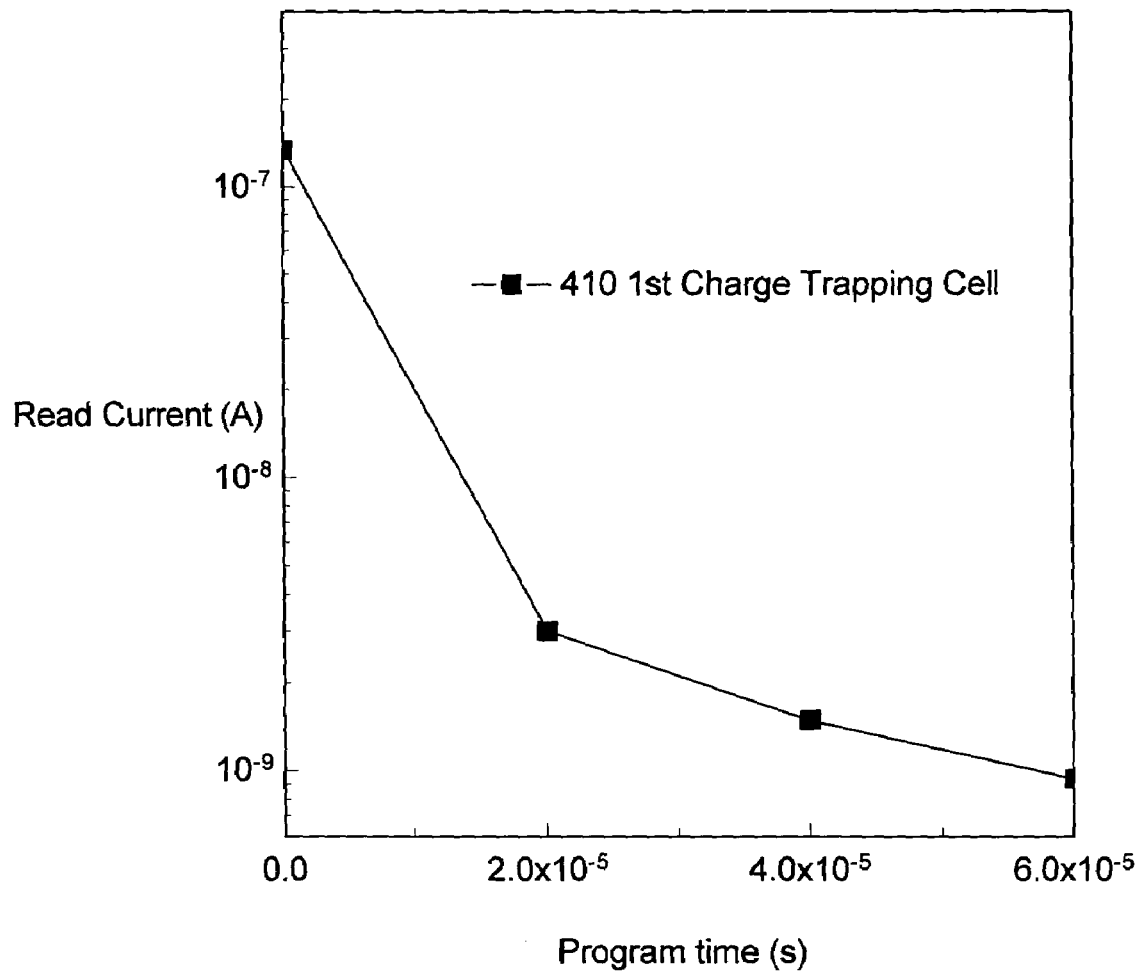
FIG. 4B is a graph showing a program operation being performed on a charge trapping structure of a memory cell.
Figure 4C:
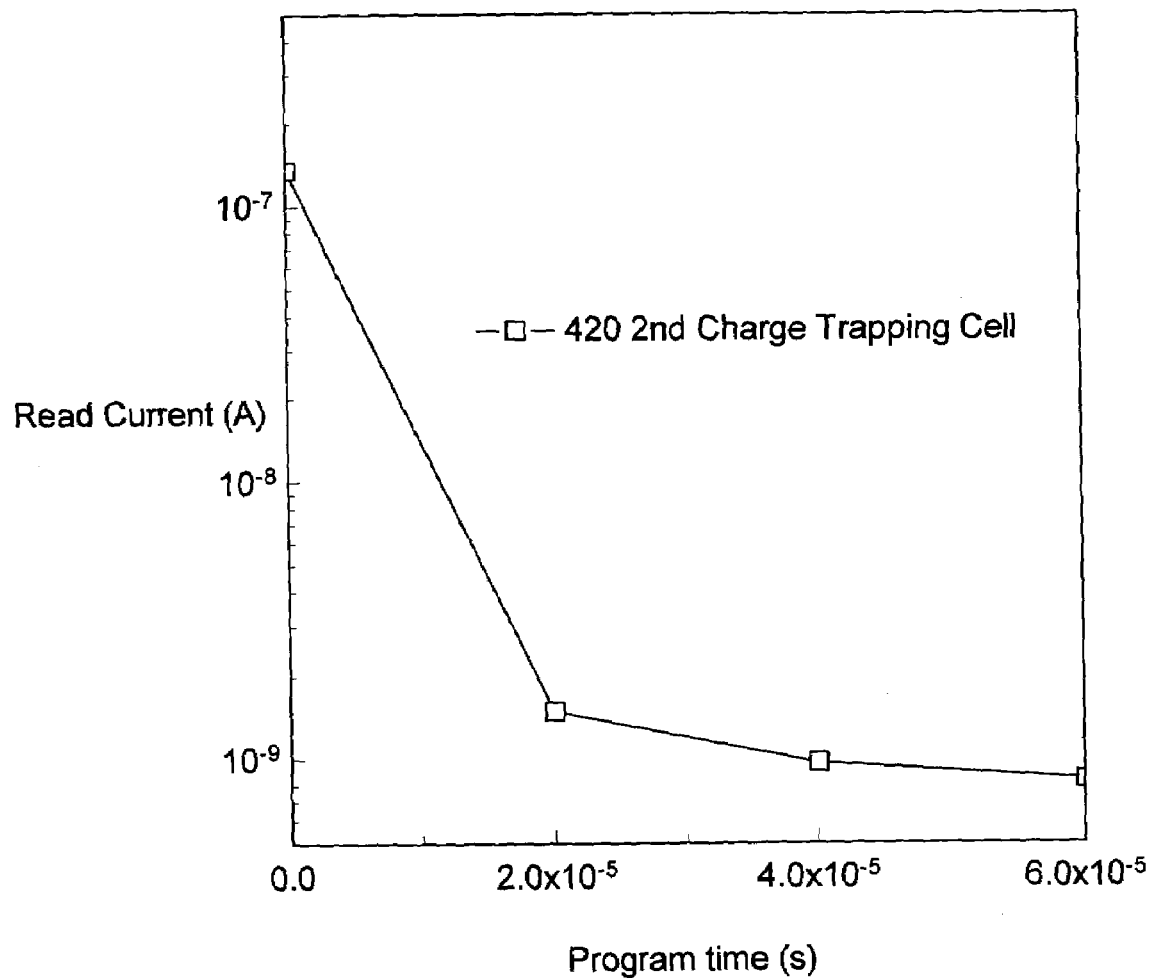
FIG. 4C is a graph showing a program operation being performed on another charge trapping structure of another memory cell.

FIGS. 4A, 4B, and 4C are graphs that show program and erase operations being performed on the memory cell, with data points taken by band-to-band read operations.

In the graph of FIG. 4A, memory cells each having a charge trapping part in a programmed state are erased via E-field assisted electron tunneling, induced by relatively high negative bias on the gate, and relatively high positive bias on the body region. The charge trapping part of both memory cells are simultaneously erased in the graph by applying −19.5 V to the gate, and grounding the body region, while the contact region is floating. For each data point, the read operation is performed by applying −10 V to the gate, 2 V to the contact region, and grounding the body region.

In the graph of FIG. 4B, the first charge trapping memory cell undergoes programming, and in the graph of FIG. 4C, the second charge trapping memory cell undergoes programming. Curve 410 represents the read current of the first charge trapping memory cell. Curve 420 represents the read current of the second charge trapping memory cell. In FIG. 4B, the first charge trapping memory cell is programmed by applying −8 V to the gate and 5V to the contact region, and grounding the body region. In FIG. 4B, as the charge trapping structure is undergoing programming, the read current curve of the charge trapping structure 410 drops from a highest level of about 100 nA to a lowest level of about 1 nA. The programming of the first charge trapping memory cell does not substantially affect the read current curve of the neighboring second charge trapping memory cell 420. In FIG. 4C, the second charge trapping memory cell is programmed by applying −8 V to the gate and 5 V to the contact region, and grounding the body region. In FIG. 4C, as the second charge trapping memory cell is undergoing programming, the read current curve of the second charge trapping memory cell 420 drops from a highest level of about 100 nA to a lowest level of about 1 nA. The programming of the second charge trapping memory cell does not substantially affect the read current curve of the first charge trapping memory cell 410. For each data point in FIGS. 4B and 4C, the read operation is performed by applying −10 V to the gate, 2 V to the contact region, and grounding the body region.

The sensing window shown in FIGS. 4B and 4C is relatively wide, because there is no reverse read which couples the measurement of the charge storage state of the charge trapping structure of interest with the charge storage state of another charge trapping structure, even if the two charge trapping structures belong to adjacent charge trapping memory cells. The read current resulting from a band-to-band read operation performed on a first charge trapping memory cell is relatively insensitive to the logical state of an adjacent second charge trapping memory cell, and the read current resulting from a band-to-band read operation performed on the second charge trapping memory cell is relatively insensitive to the logical state of the adjacent first charge trapping memory cell. Each charge trapping structure can store one bit or multiple bits. For example, if each charge trapping structure stores two bits, then there are four discrete levels of charge.

Figure 5A:
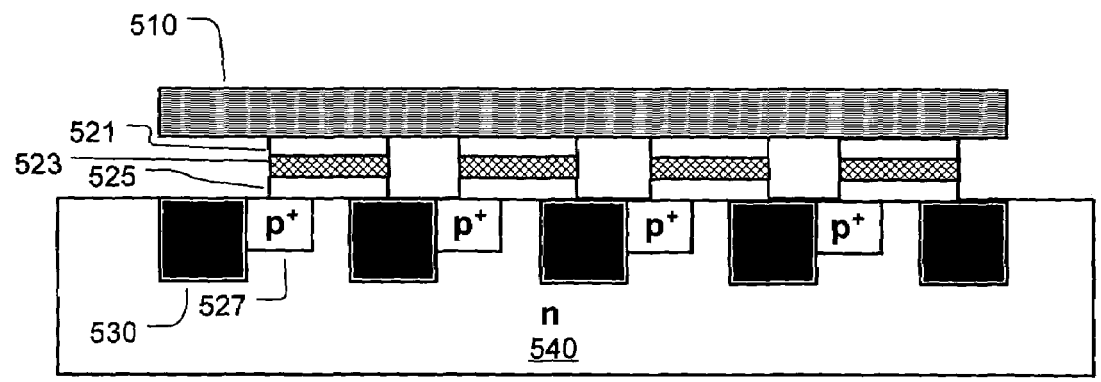
FIG. 5A is a simplified diagram of charge trapping memory cells with an p-type contact region having an isolation region between adjacent charge trapping memory cells.
Figure 5B:
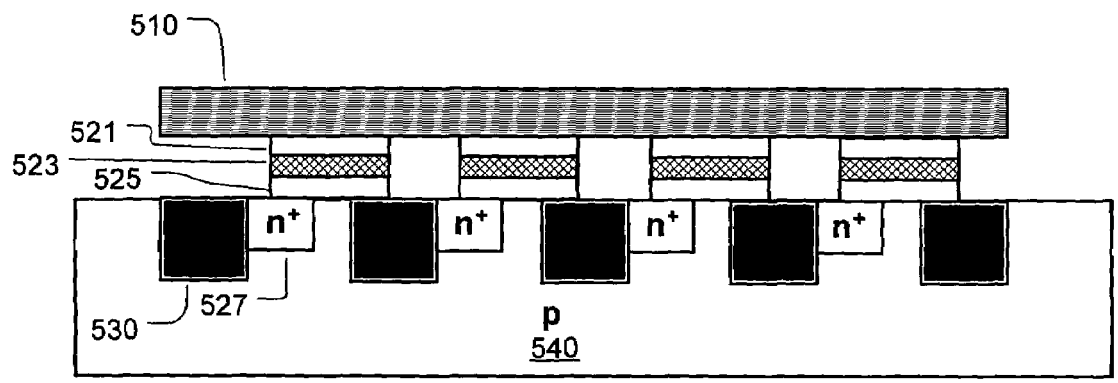
FIG. 5B is a simplified diagram of charge trapping memory cells with a n-type contact region having an isolation region between adjacent charge trapping memory cells.

FIGS. 5A and 5B are simplified diagrams of charge trapping memory cells having an isolation region between adjacent charge trapping memory cells. In FIG. 5A, each memory cell has a p+-doped contact region 527, a bottom oxide 525, a charge trapping structure 523, a top oxide 521, and an isolation region 530. The memory cells are formed in an n-type substrate. A word line 510 provides a gate voltage to memory cells in a common row, and the bit line provides the contact region voltage to the p+-doped contact region 527 to memory cells in a common column. The memory cells in FIG. 5B are similar, but are formed in a p-type substrate 540 and have an n+-doped contact region 527.

Figure 6A:
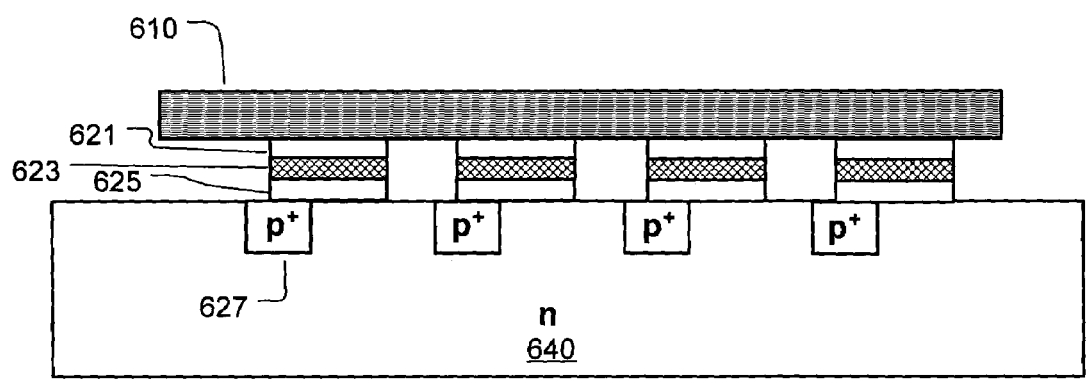
FIG. 6A is a simplified diagram of charge trapping memory cells with a p-type contact region without an isolation region between adjacent charge trapping memory cells.
Figure 6B:
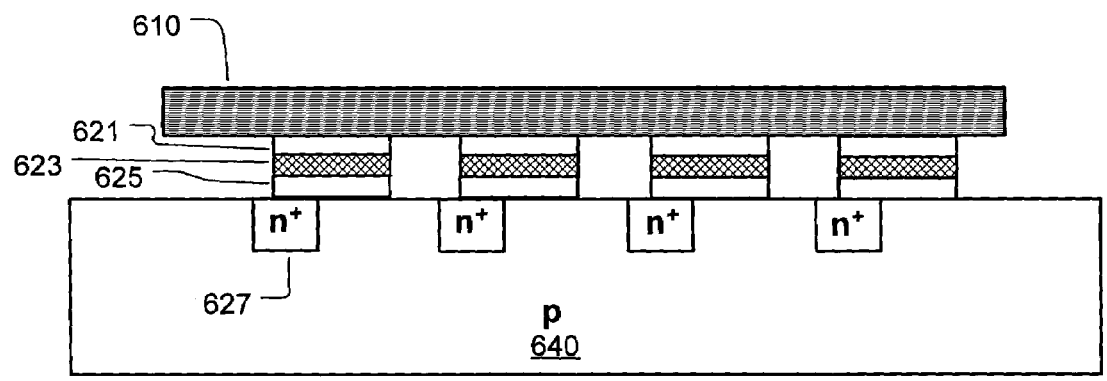
FIG. 6B is a simplified diagram of charge trapping memory cells with an n-type contact region without an isolation region between adjacent charge trapping memory cells.

FIGS. 6A and 6B are simplified diagrams of charge trapping memory cells. In contrast with the memory cells of FIGS. 5A and 5B, in FIGS. 6A and 6B the memory cells are formed without an isolation region between adjacent charge trapping memory cells. In FIG. 6A, each memory cell has a p+-doped contact region 627, a bottom oxide 625, a charge trapping structure 623, and a top oxide 621. The memory cells are formed in an n-type substrate. A word line 610 provides a gate voltage to memory cells in a common row, and the bit line provides the contact region voltage to the p+-doped contact region 627 to memory cells in a common column. The memory cells in FIG. 6B are similar, but are formed in a p-type substrate 640 and have an n+-doped contact region 627.

Figure 7A:
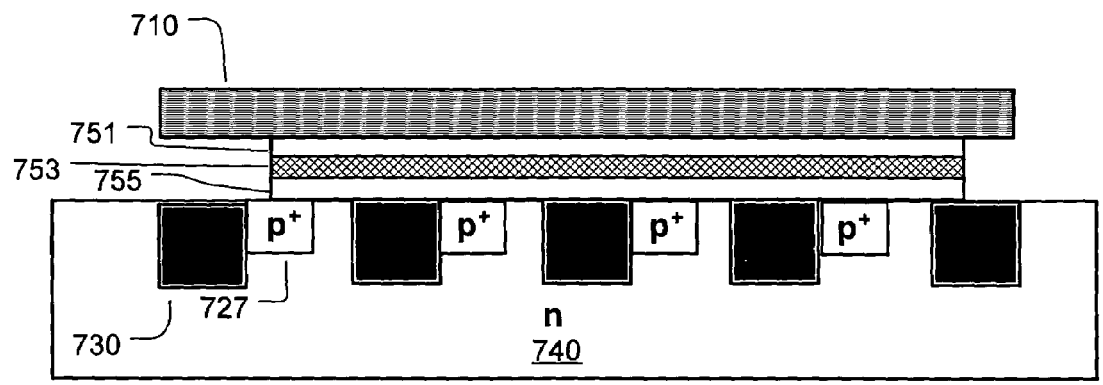
FIG. 7A is a simplified diagram of charge trapping memory cells with a p-type contact region and ONO stack continuous through the string of charge trapping memory cells having an isolation region between adjacent charge trapping memory cells.
Figure 7B:
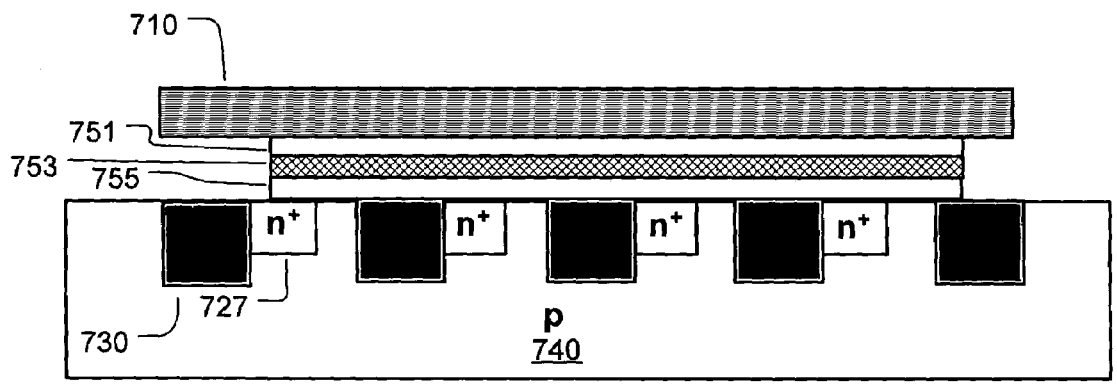
FIG. 7B is a simplified diagram of charge trapping memory cells with an n-type contact region and ONO stack continuous through the string of charge trapping memory cells having an isolation region between adjacent charge trapping memory cells.

FIGS. 7A and 7B are simplified diagrams of charge trapping memory cells. In contrast with the memory cells of FIGS. 5A and 5B, in FIGS. 7A and 7B the memory cells are formed with an ONO stack running continuously through the string of charge trapping memory cells. In FIG. 7A, each memory cell has a p+-doped contact region 727, a bottom oxide 725, a charge trapping structure 723, a top oxide 721, and an isolation region 730. The memory cells are formed in an n-type substrate. A word line 710 provides a gate voltage to memory cells in a common row, and the bit line provides the contact region voltage to the p+-doped contact region 727 to memory cells in a common column. The memory cells in FIG. 7B are similar, but are formed in a p-type substrate 740 and have an n+-doped contact region 727.

Figure 8A:
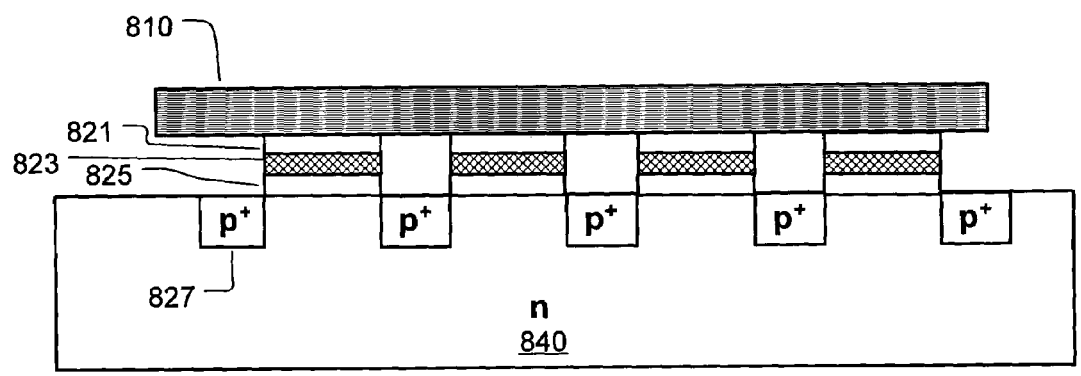
FIGS. 8A and 8B are simplified diagrams from the X-direction and Y-direction respectively of a string of charge trapping memory cells with a p-type contact region without an isolation region between adjacent charge trapping memory cells in the X-direction, and with an isolation region between adjacent charge trapping memory cells in the Y-direction.
Figure 8B:
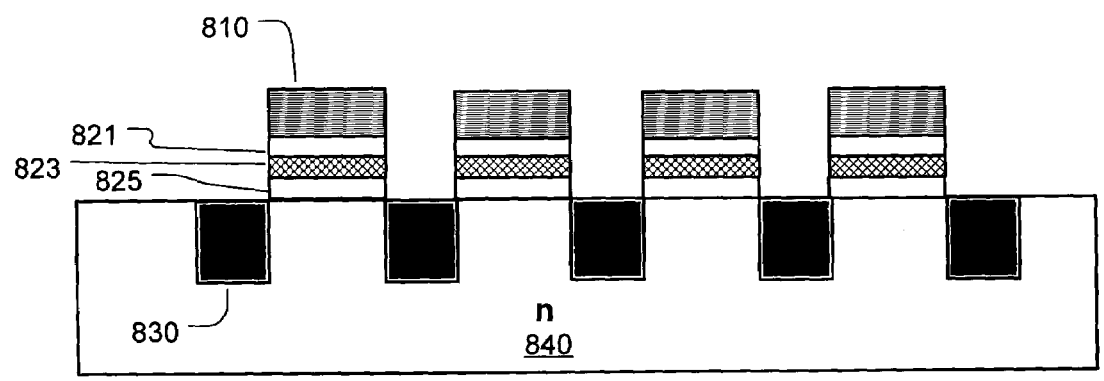

FIGS. 8A and 8B are simplified diagrams of a string of charge trapping memory cells with a p-type contact region. FIG. 8A shows the string of charge trapping memory cells from the X-direction without an isolation region between adjacent charge trapping memory cells. Each memory cell has a p+-doped contact region 827, a bottom oxide 825, a charge trapping structure 823, and a top oxide 821. The memory cells are formed in an n-type substrate 840. A word line 810 provides a gate voltage to memory cells in a common row (i.e., a common word line), and the bit line provides the contact region voltage to the p+-doped contact region 827 of memory cells in a common column (i.e., a common bit line). FIG. 8B shows the string of charge trapping memory cells from the Y-direction with an isolation region between adjacent charge trapping memory cells. Each memory cell has a bottom oxide 825, a charge trapping structure 823, a top oxide 821, and an isolation region 830. The memory cells are formed in an n-type substrate 840. A word line 810 provides a gate voltage to memory cells in a common row (i.e., a common word line).

Figure 9A:
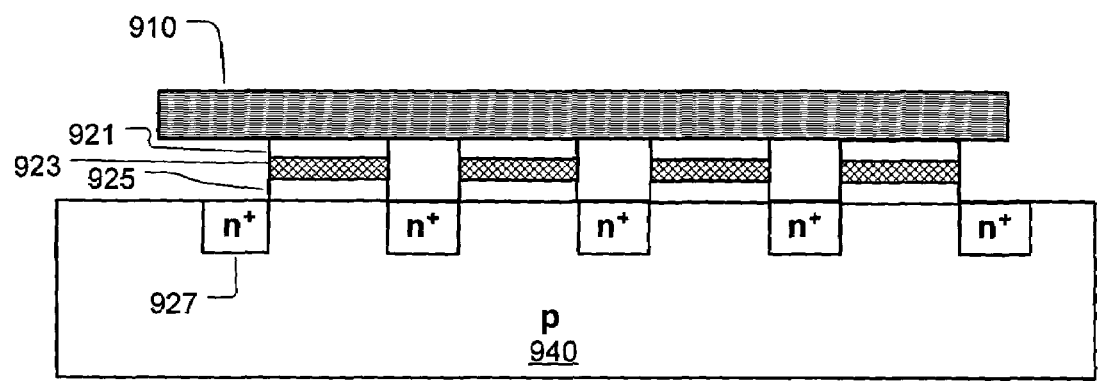
FIGS. 9A and 9B are simplified diagrams from the X-direction and Y-direction respectively of a string of charge trapping memory cells with a n-type contact region without an isolation region between adjacent charge trapping memory cells in the X-direction, and with an isolation region between adjacent charge trapping memory cells in the Y-direction.
Figure 9B:
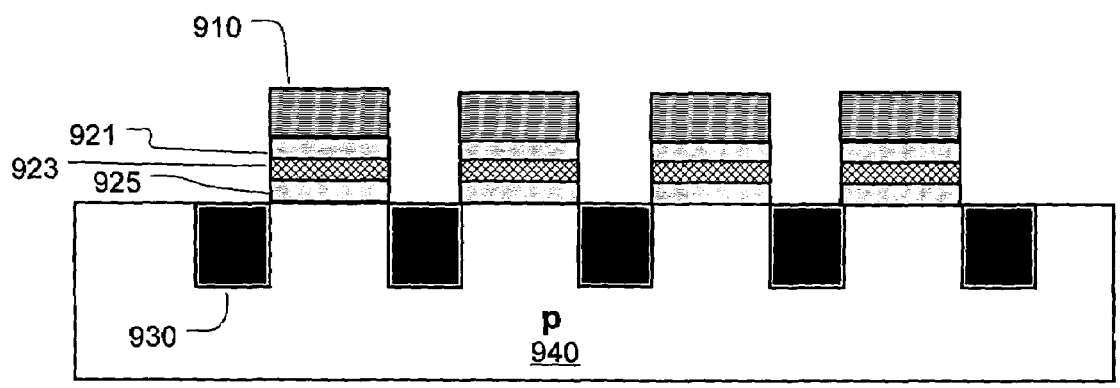

FIGS. 9A and 9B are simplified diagrams of a string of charge trapping memory cells with an n-type contact region. FIG. 9A shows the string of charge trapping memory cells from the X-direction without an isolation region between adjacent charge trapping memory cells. Each memory cell has an n+-doped contact region 927, a bottom oxide 925, a charge trapping structure 923, and a top oxide 921. The memory cells are formed in a p-type substrate 940. A word line 910 provides a gate voltage to memory cells in a common row (i.e., a common word line), and the bit line provides the contact region voltage to the n+-doped contact region 927 of memory cells in a common column (i.e., a common bit line). FIG. 9B shows the string of charge trapping memory cells from the Y-direction with an isolation region between adjacent charge trapping memory cells. Each memory cell has a bottom oxide 925, a charge trapping structure 923, a top oxide 921, and an isolation region 930. The memory cells are formed in a p-type substrate 940. A word line 910 provides a gate voltage to memory cells in a common row (i.e., a common word line).

Figure 10:
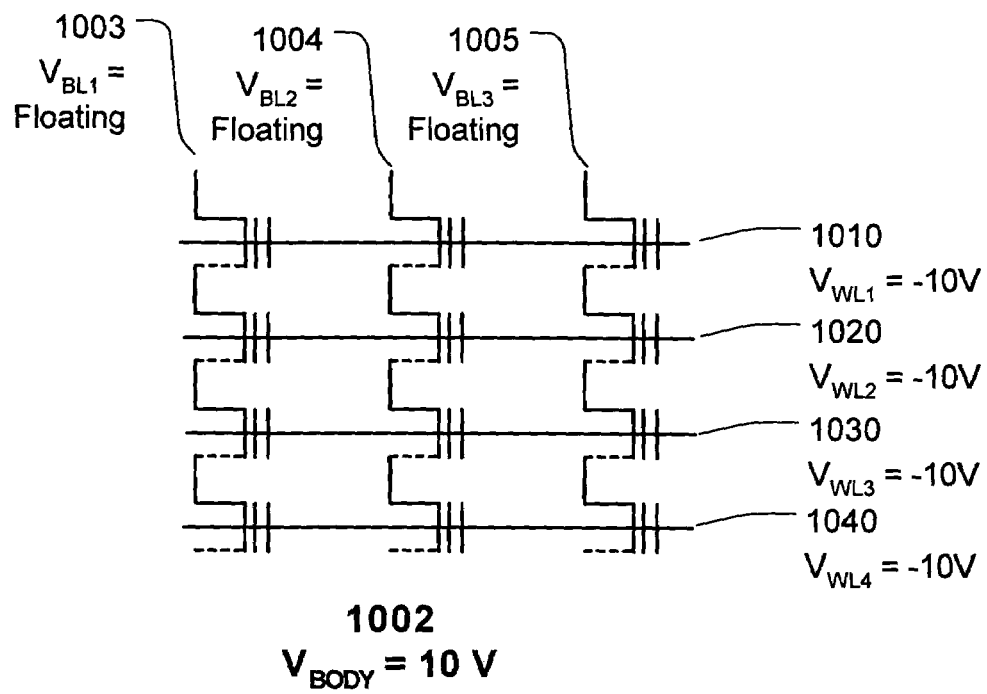
FIG. 10 is a simplified diagram of strings of charge trapping memory cells, showing an erase operation being performed on the strings of charge trapping memory cells, with a negative voltage applied to the gates relative to the body regions.

FIG. 10 is a simplified diagram of strings of charge trapping memory cells, showing an erase operation being performed on the strings of charge trapping memory cells. The voltage of the body region 1002 is 10 V. The word lines of the memory cells to be erased 1010, 1020, 1030, and 1040 have a voltage of −10 V. The bit lines 1003, 1004, and 1005 which provide the contact region voltages are floating. The memory cells of the array are erased, for example via FN tunneling of electrons from the gate to the charge trapping structure and from the charge trapping structure to the body region.

Figure 11:
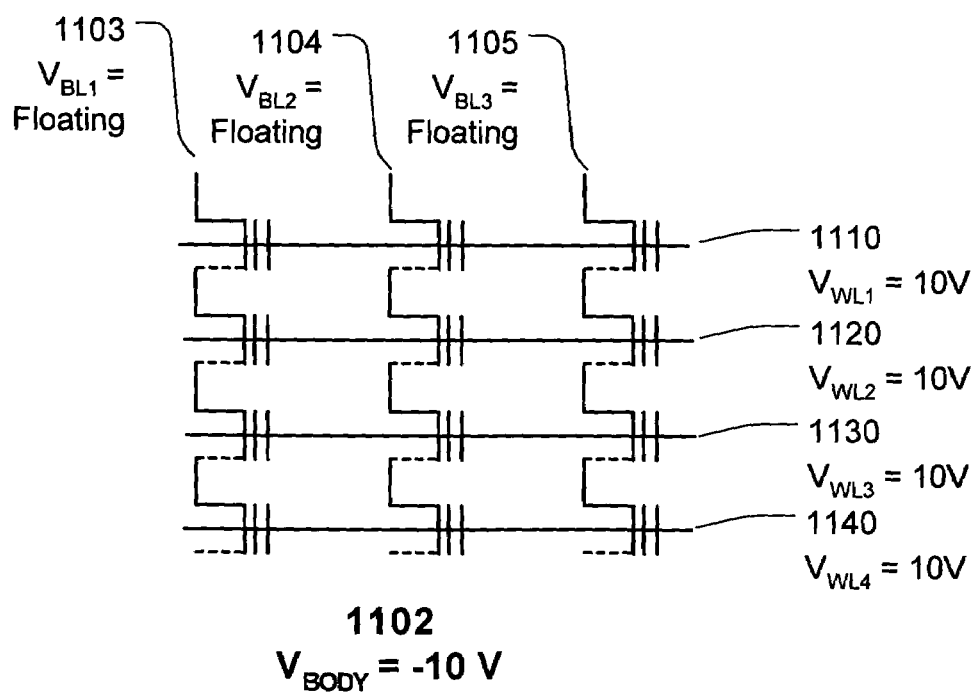
FIG. 11 is a simplified diagram of strings of charge trapping memory cells, showing an erase operation being performed on the strings of charge trapping memory cells, with a positive voltage applied to the gates relative to the body regions.

FIG. 11 is a simplified diagram of strings of charge trapping memory cells, showing an erase operation being performed on the strings of charge trapping memory cells. The voltage of the body region 1102 is −10 V. The word lines of the memory cells to be erased 1110, 1120, 1130, and 1140 have a voltage of 10 V. The bit lines 1103, 1104, and 1105 which provide the contact region voltages are floating. The memory cells of the array are erased, for example via FN tunneling of electrons from the gate to the charge trapping structure and from the charge trapping structure to the body region.

Figure 12:
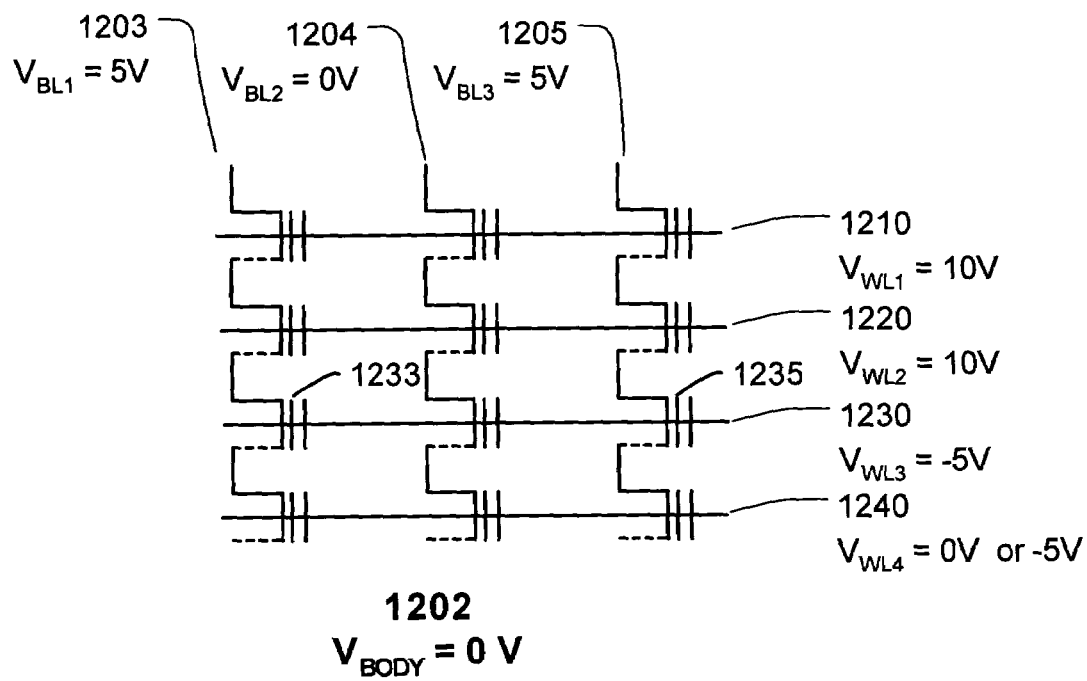
FIG. 12 is a simplified diagram of strings of charge trapping memory cells, showing a programming operation being performed on selected memory cells of the strings of charge trapping memory cells.

FIG. 12 is a simplified diagram of strings of charge trapping memory cells, showing a programming operation being performed on selected memory cells of the strings of charge trapping memory cells. The body region 1202 is grounded. The bit lines 1203 and 1205 which provide the contact region voltages of the memory cells to be programmed has a voltage of 5 V. The bit line 1204 not corresponding to the contact region of any memory cells to be programmed is grounded. The word line 1230 of the memory cells to be programmed has a voltage of −5 V. The word lines 1210 and 1220 between the bit lines 1203, 1204, and 1205, and the word line 1230 of the memory cells to be programmed have a voltage of 10 V. The word line 1240 on the other side of the word line 1230 of the memory cells to be programmed has a voltage of −5 V, or can be grounded. The 10 V on the word lines 1210 and 1220 cause an inversion in the body regions of the memory cells of word lines 1210 and 1220, and the inversions electrically couple the voltages of bit lines 1203, 1204, and 1205 to the contact regions of the memory cells of word line 1230. The charge trapping structures 1233 and 1235 belong to the only memory cells at the intersection of: bit lines 1203 and 1205 and word line 1230 with voltages sufficiently high to cause the injection of charge across the bottom oxide of memory cells into the charge trapping structure. Thus, only the charge trapping structures 1233 and 1235 are programmed.

Figure 13:
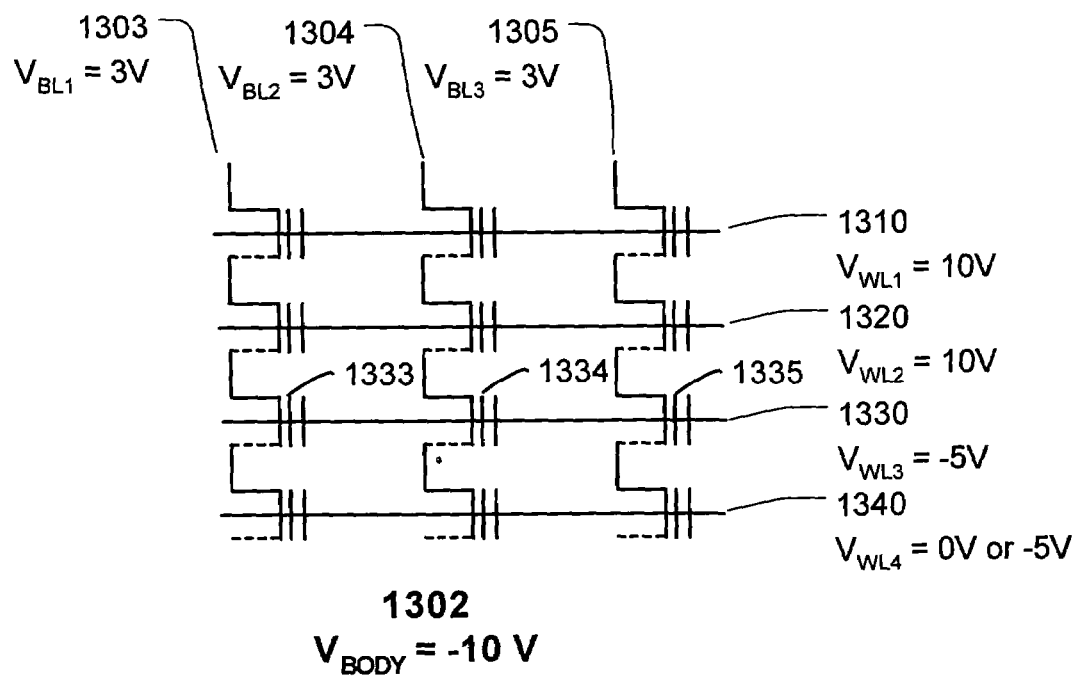
FIG. 13 is a simplified diagram of strings of charge trapping memory cells, showing a read operation being performed on the strings of charge trapping memory cells.

FIG. 13 is a simplified diagram of strings of charge trapping memory cells, showing a read operation being performed on selected memory cells of the strings of charge trapping memory cells. The body region 1302 has a voltage of −10 V. The bit lines 1303, 1304, and 1305 which provide the contact region voltages of the memory cells to be read have a voltage of 3 V. Alternatively, any bit lines not corresponding to the contact region of any memory cells to be read can be grounded. The word line 1330 of the memory cells to be read has a voltage of −5 V. The word lines 1310 and 1320 between the bit lines 1303, 1304, and 1305, and the word line 1330 of the memory cells to be read have a voltage of 10 V. The word line 1340 on the other side of the word line 1330 of the memory cells to be programmed has a voltage of −5 V, or can be grounded. The 10 V on the word lines 1310 and 1320 cause an inversion in the body regions of the memory cells of word lines 1310 and 1320, and the inversions electrically couple the voltages of bit lines 1303, 1304, and 1305 to the contact regions of the memory cells of word line 1330. The charge trapping structures 1333, 1334, and 1335 belong to the only memory cells at the intersection of: bit lines 1303, 1304, and 1305 and word line 1330 with voltages sufficiently high to cause band-to-band current to flow between the contact regions and the body regions of the memory cells. Thus, only the charge trapping structures 1333, 1334, and 1335 are read.

Figure 14:
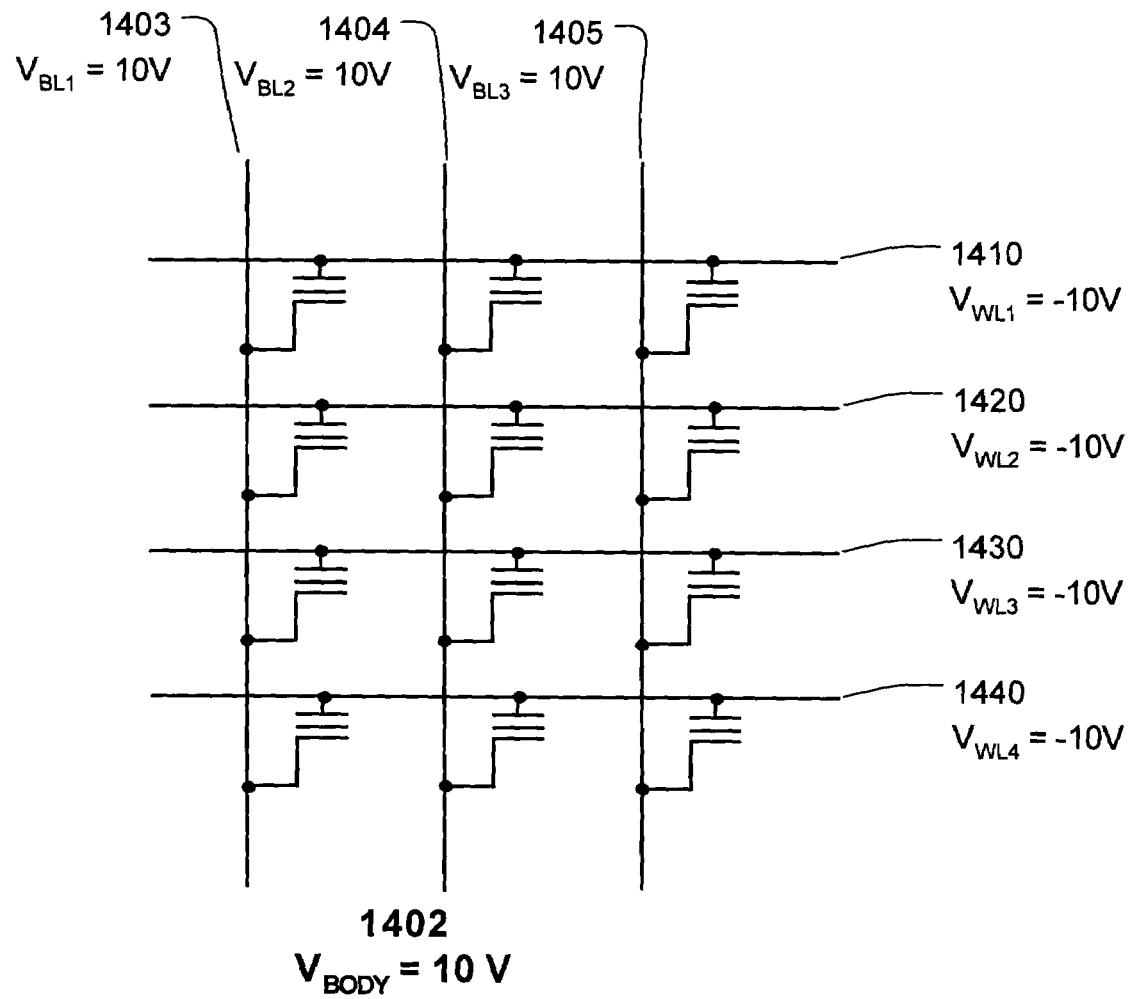
FIG. 14 is a simplified diagram of an array of charge trapping memory cells, showing an erase operation being performed on the array of charge trapping memory cells, with a negative voltage applied to the gates relative to the body regions.

FIG. 14 is a simplified diagram of an array of charge trapping memory cells, showing an erase operation being performed on the array of charge trapping memory cells. The body region 1402 has a voltage of 10 V. The bit lines 1403, 1404, and 1405 which provide the contact region voltages of the memory cells to be read have a voltage of 10 V. The word lines 1410, 1420, 1430, and 1440 of the memory cells to be erased have a voltage of −10 V. The memory cells of the array are erased, for example via FN tunneling of electrons to the body region from the charge trapping structure and to the charge trapping structure from the gate.

Figure 15:
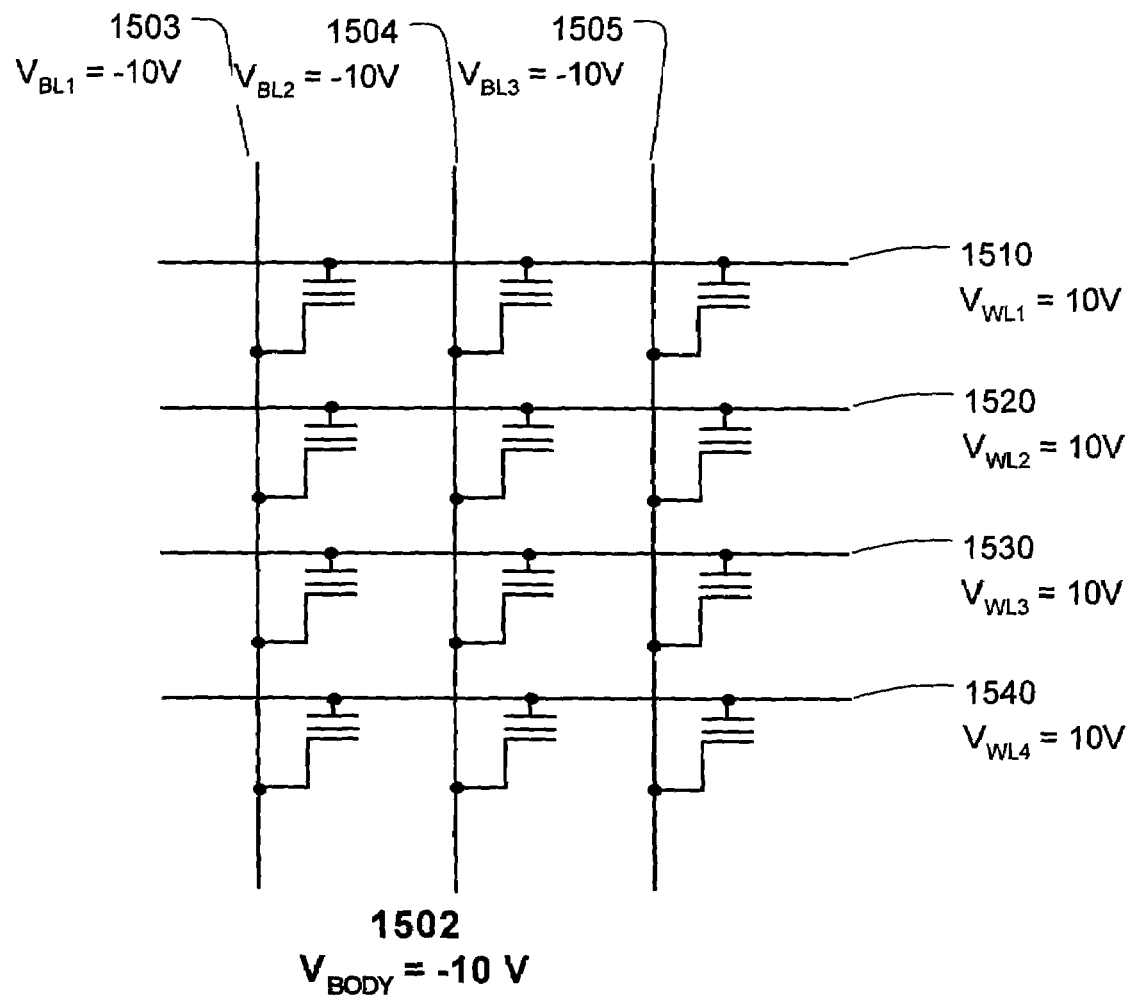
FIG. 15 is a simplified diagram of an array of charge trapping memory cells, showing an erase operation being performed on the array of charge trapping memory cells, with a positive voltage applied to the gates relative to the body regions.

FIG. 15 is a simplified diagram of an array of charge trapping memory cells, showing an erase operation being performed on the array of charge trapping memory cells. Unlike the erase operation in FIG. 14, in FIG. 15 a positive voltage is applied to the gates relative to the body regions. The body region 1502 has a voltage of −10 V. The bit lines 1503, 1504, and 1505 which provide the contact region voltages of the memory cells to be read have a voltage of −10 V. The word lines 1510, 1520, 1530, and 1540 of the memory cells to be erased have a voltage of 10 V. The memory cells of the array are erased, for example via FN tunneling of electrons from the body region to the charge trapping structure and from the charge trapping structure to the gate.

Figure 16:
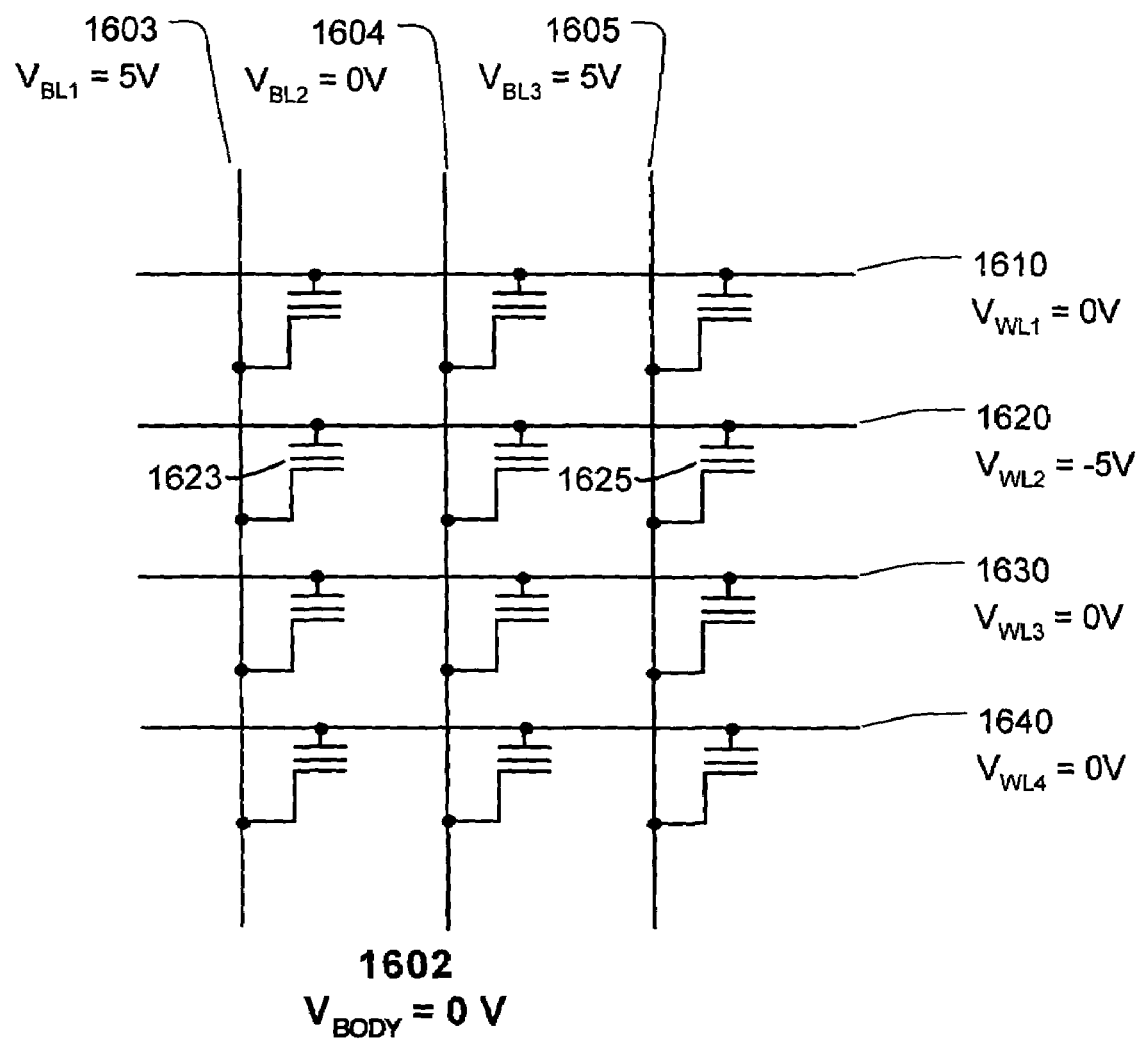
FIG. 16 is a simplified diagram of an array of charge trapping memory cells, showing a programming operation being performed on selected memory cells of the array of charge trapping memory cells.

FIG. 16 is a simplified diagram of an array of charge trapping memory cells, showing a programming operation being performed on selected memory cells of the array of charge trapping memory cells. The body region 1602 is grounded. The bit lines 1603 and 1605 which provide the contact region voltages of the memory cells to be programmed has a voltage of 5 V. The bit line 1604 not corresponding to the contact region of any memory cells to be programmed is grounded. The word line 1620 of the memory cells to be programmed has a voltage of −5 V. The word lines 1610, 1630, and 1640 not corresponding to any memory cells to be programmed are grounded. The charge trapping structures 1623 and 1625 belong to the only memory cells at the intersection of: bit lines 1603 and 1605 and word line 1620 with voltages sufficiently high to cause the injection of charge across the bottom oxide of memory cells into the charge trapping structure. Thus, only the charge trapping structures 1623 and 1625 are programmed.

Figure 17:
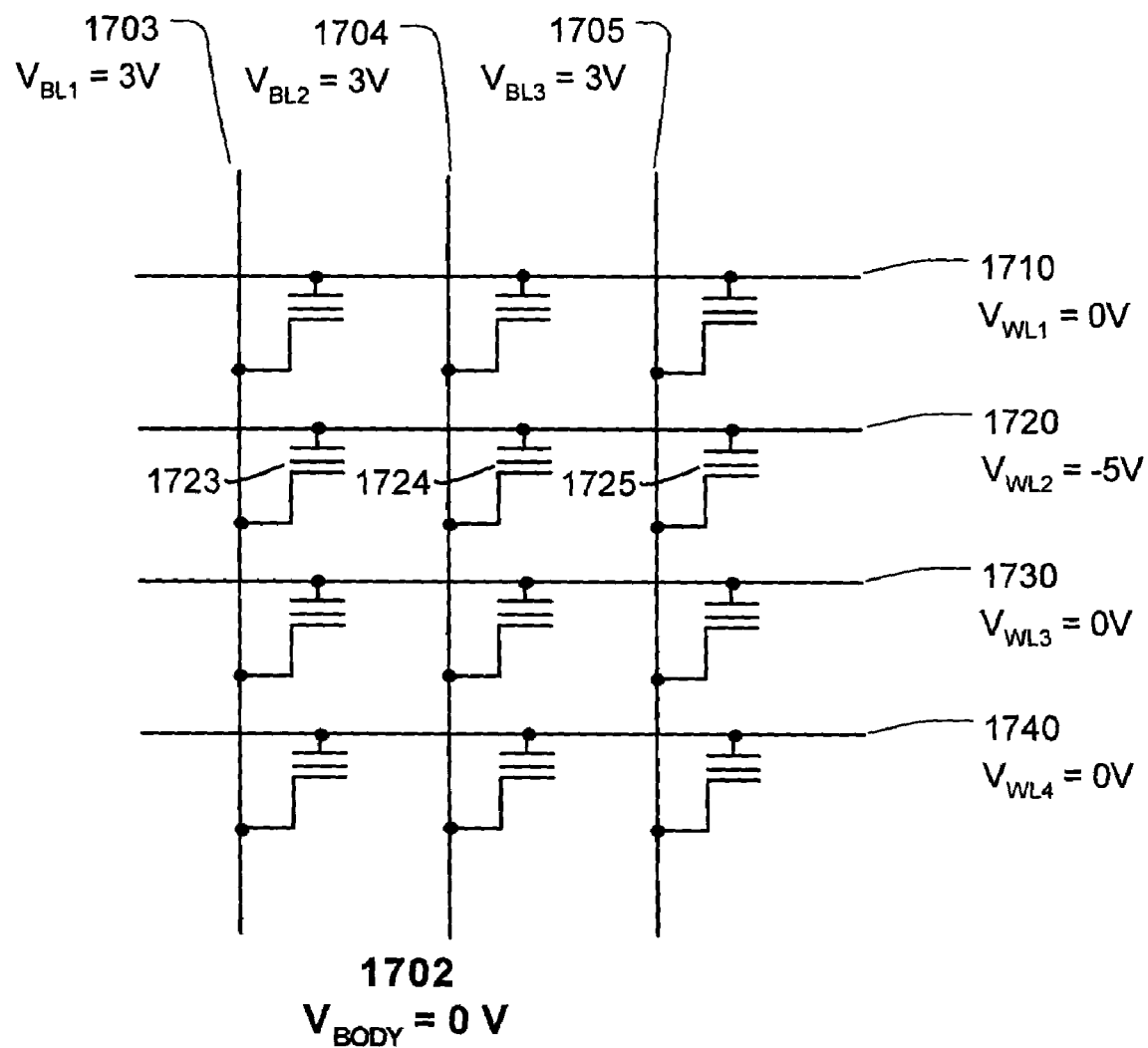
FIG. 17 is a simplified diagram of an array of charge trapping memory cells, showing a read operation being performed on the array of charge trapping memory cells.

FIG. 17 is a simplified diagram of an array of charge trapping memory cells, showing a read operation being performed on the array of charge trapping memory cells. The body region 1702 is grounded. The bit lines 1703, 1704, and 1705 which provide the contact region voltages of the memory cells to be read have a voltage of 3 V. Alternatively, any bit lines not corresponding to the contact region of any memory cells to be read can be grounded. The word line 1720 of the memory cells to be programmed has a voltage of −5 V. The word lines 1710, 1730, and 1740 not corresponding to any memory cells to be read are grounded. The charge trapping structures 1723, 1724, and 1725 belong to the only memory cells at the intersection of: bit lines 1703, 1704, and 1705 and word line 1720 with voltages sufficiently high to cause band-to-band current to flow between the contact regions and the body regions of the memory cells. Thus, only the charge trapping structures 1723, 1724, and 1725 are read.

Figure 18:
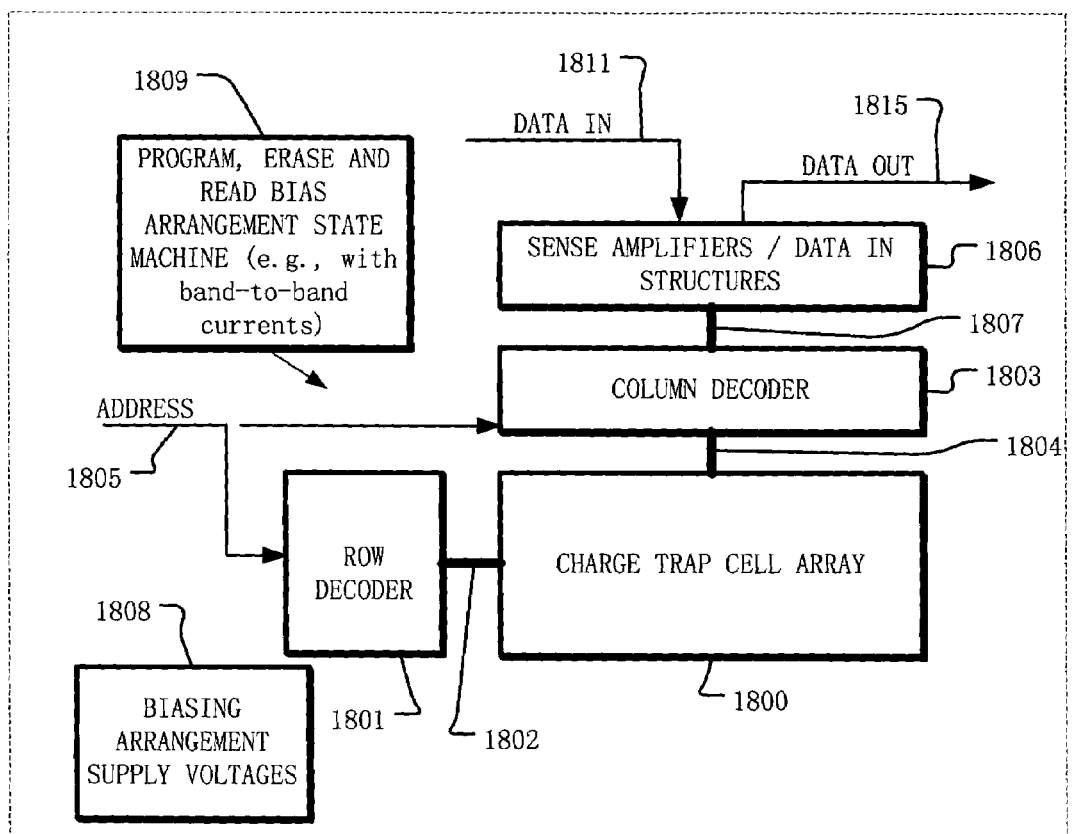
FIG. 18 is a simplified diagram of an integrated circuit with an array of charge trapping memory cells and control circuitry.
Figure 12:
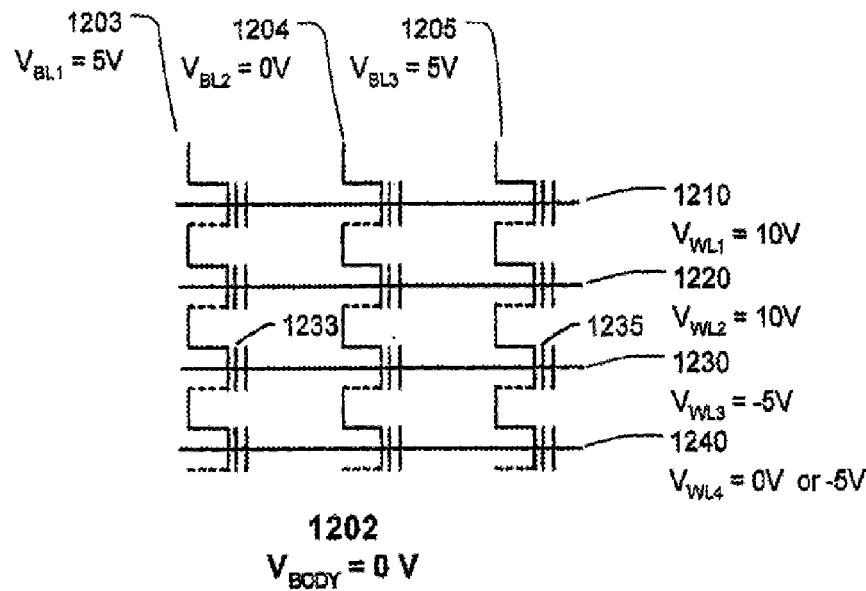
Figure 13:
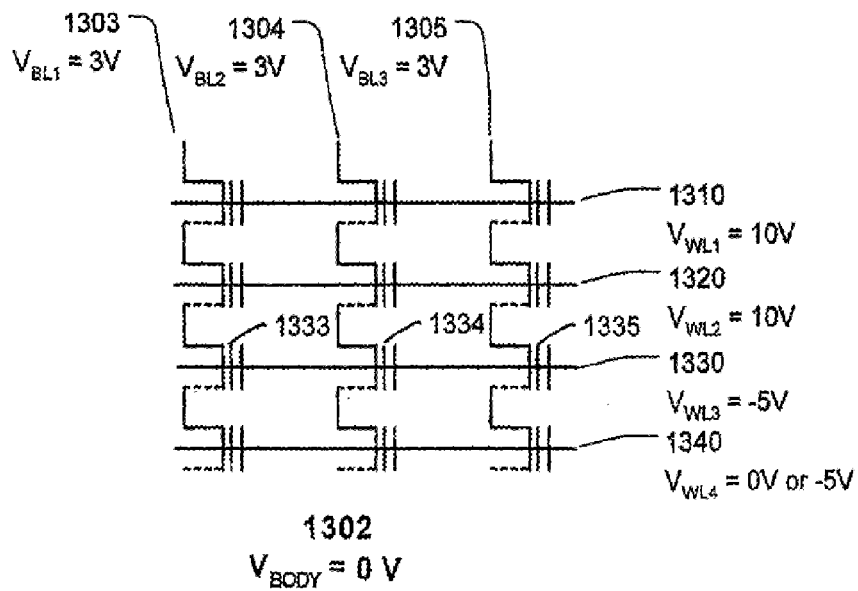

FIG. 18 is a simplified block diagram of an integrated circuit according to an embodiment. The integrated circuit 1850 includes a memory array 1800 implemented using charge trapping memory cells, on a semiconductor substrate. A row decoder 1801 is coupled to a plurality of word lines 1802 arranged along rows in the memory array 1800. A column decoder 1803 is coupled to a plurality of bit lines 1804 arranged along columns in the memory array 1800. Addresses are supplied on bus 1805 to column decoder 1803 and row decoder 1801. Sense amplifiers and data-in structures in block 1806 are coupled to the column decoder 1803 via data bus 1807. Data is supplied via the data-in line 1811 from input/output ports on the integrated circuit 1850, or from other data sources internal or external to the integrated circuit 1850, to the data-in structures in block 1806. Data is supplied via the data-out line 1815 from the sense amplifiers in block 1806 to input/output ports on the integrated circuit 1850, or to other data destinations internal or external to the integrated circuit 1850. A bias arrangement state machine 1809 controls the application of bias arrangement supply voltages 1808, such as for the erase verify and program verify voltages, and the arrangements for programming, erasing, and reading the memory cells, such as with the band-to-band currents.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method of operating an array of memory cells arranged in rows and columns, each of the columns including memory cells arranged in a series from a contact, each of the memory cells comprising a body region, a contact region, a bottom dielectric, a charge trapping structure having a charge storage state, a top dielectric, and a gate, the method comprising:

applying a first bias arrangement to determine the charge storage state of the charge trapping structure of at least a selected memory cell in the series, wherein the first bias arrangement electrically couples the contact region of the selected memory cell to the contact by causing inversion in the body region of memory cells between the selected memory cell and the contact; and measuring current flowing between the body region of the selected memory cell and the contact to determine the charge storage state of the charge trapping structure of the selected memory cell.

2. The method of claim 1, wherein the body region and the contact region are part of a semiconductor substrate.

3. The method of claim 1, wherein the first bias arrangement applies a voltage difference between the body region of the selected memory cell and the contact region of the selected memory cell.

4. The method of claim 1, wherein the first bias arrangement causes a first voltage difference between the gate of the selected memory cell and the contact region of the selected memory cell, and a second voltage difference between the body region of the selected memory cell and the contact region of the selected memory cell, wherein the first voltage difference and the second voltage difference cause sufficient band-to-band tunneling current for said measuring, and the first voltage difference and the second voltage differences fail to change the charge storage state of the selected memory cell.

5. The method of claim 1, wherein the first bias arrangement causes a first voltage difference of at least about 5 V between the gate of the selected memory cell and the contact region of the selected memory cell, and a second voltage difference less than about 5 V between the body region of the selected memory cell and the contact region of the selected memory cell.

6. The method of claim 1, wherein the first bias arrangement induces at least a band-to-band current component through the contact region of the selected memory cell.

7. The method of claim 1, wherein the body region of the selected memory cell is a well in a semiconductor substrate.

8. The method of claim 1, further comprising:

applying a second bias arrangement to adjust the charge storage state of the selected memory cell by increasing a net positive charge in the charge trapping structure of the selected memory cell; and applying a third bias arrangement to adjust the charge storage state of the selected memory cell by increasing a net negative charge in the charge trapping structure of the selected memory cell.

9. The method of claim 1, further comprising:

applying a second bias arrangement to adjust the charge storage state of the selected memory cell by increasing a net positive charge in the charge trapping structure of the selected memory cell, thereby programming the selected memory cell; and applying a third bias arrangement to adjust the charge storage state of the selected memory cell by increasing a net negative charge in the charge trapping structure, thereby erasing the selected memory cell.

10. The method of claim 1, further comprising:

applying a second bias arrangement to adjust the charge storage state of the selected memory cell by increasing a net positive charge in the charge trapping structure of the selected memory cell, thereby erasing the selected memory cell; and applying a third bias arrangement to adjust the charge storage state of the selected memory cell by increasing a net negative charge in the charge trapping structure of the selected memory cell, thereby programming the selected memory cell.

11. The method of claim 1, further comprising:

applying a second bias arrangement to adjust the charge storage state of the selected memory cell by increasing a net positive charge in the charge trapping structure of the selected memory cell; and applying a third bias arrangement to adjust the charge storage state of the selected memory cell by increasing a net negative charge in the charge trapping structure of the selected memory cell via electron tunneling from the gate of the selected memory cell.

12. The method of claim 1, further comprising:

applying a second bias arrangement to adjust the charge storage state of the selected memory cell by increasing a net positive charge in the charge trapping structure of the selected memory cell via hole tunneling from the gate of the selected memory cell; and applying a third bias arrangement to adjust the charge storage state of the selected memory cell by increasing a net negative charge in the charge trapping structure of the selected memory cell.

13. The method of claim 1, further comprising:

applying a second bias arrangement to adjust the charge storage state of the selected memory cell by increasing a net positive charge in the charge trapping structure of the selected memory cell; and applying a third bias arrangement to adjust the charge storage state of the selected memory cell by increasing a net negative charge in the charge trapping structure of the selected memory cell via electron tunneling from the body region of the selected memory cell.

14. The method of claim 1, further comprising:

applying a second bias arrangement to adjust the charge storage state of the selected memory cell by increasing a net positive charge in the charge trapping structure of the selected memory cell via hole tunneling from the body region of the selected memory cell; and applying a third bias arrangement to adjust the charge storage state of the selected memory cell by increasing a net negative charge in the charge trapping structure of the selected memory cell.

15. The method of claim 1, further comprising:
applying a second bias arrangement to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell via hot electrons from the body region of the selected memory cell.

16. The method of claim 1, further comprising:
applying a second bias arrangement to adjust the charge storage state of the selected memory cell by increasing a net positive charge in the charge trapping structure of the selected memory cell via hot holes from the body region of the selected memory cell; and
applying a third bias arrangement to adjust the charge storage state of the selected memory cell by increasing a net negative charge in the charge trapping structure of the selected memory cell.

17. The method of claim 1, further comprising:
applying a second bias arrangement to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell via band-to-band hot electrons from the contact region of the selected memory cell.

18. The method or claim 1, further comprising:
applying a second bias arrangement to adjust the charge storage state of the selected memory cell by increasing a net positive charge in the charge trapping structure of the selected memory cell via band-to-band hot holes from the contact region of the selected memory cell; and
applying a third bias arrangement to adjust the charge storage state of the selected memory cell by increasing a net negative charge in the charge trapping structure of the selected memory cell.

19. The method of claim 1, wherein the charge storage state of each part of the charge trapping structure of the selected memory cell stores one bit.

20. The method of claim 1, wherein the charge storage state or each part of the charge trapping structure of the selected memory cell stores multiple bits.

21. The method of claim 1, wherein hot holes generated during the first bias arrangement are insufficient to disturb the charge storage state of the selected memory cell.

22. The method of claim 1, wherein hot electrons generated during the first bias arrangement are insufficient to disturb the charge storage state of the selected memory cell.

23. The method of claim 1, further comprising:
applying a second bias arrangement to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell,
wherein said current is about 100 nA for the charge storage state of the selected memory cell adjusted by one of the second bias arrangement and the third bias arrangement, and said current is about 1 nA for the charge storage state of the selected memory cell adjusted by the other of the second bias arrangement and the third bias arrangement.

24. The method of claim 1, further comprising:
applying a second bias management to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell,
wherein said current is at least about 10 times greater for the charge storage state of the selected memory cell adjusted by one of the second bias arrangement and the third bias arrangement than said current for the charge storage state of the selected memory cell adjusted by the other of the second bias arrangement and the third bias arrangement.

25. A nonvolatile memory, comprising:
a plurality of bit lines;
a memory array including a plurality of memory cells arranged in rows and columns, each of the columns including memory cells arranged in a series from a contact, each of the columns coupled to a corresponding bit line of the plurality of bit lines at the contact, each memory cell including:
a body region;
a contact region coupled to the body region;
a bottom dielectric coupled to the body region;
a charge trapping structure coupled to the bottom dielectric having a charge storage state; and
a top dielectric coupled to the charge trapping structure;
a plurality of word lines coupled to the top dielectrics of the plurality of memory cells, each word line of the plurality of word lines providing voltage as a gate for memory cells coupled to said each word line; and
logic coupled to the plurality of bit lines and the plurality of word lines, the logic applying a first bias arrangement to determine the charge storage state of the charge trapping structure of at least a selected memory cell, and the logic measuring current flowing in response to the first biasing arrangement to determine the charge storage state of the charge trapping structure of the selected memory cell, the current flowing between the body region of the selected memory cell and the contact region of the selected memory cell.

26. The memory of claim 25, wherein the contact region of said each memory cell is a portion of at least one of the plurality of bit lines.

27. The memory of claim 25, wherein the logic biases, to have inversion in the body region, any transistors in a selected column between 1) the contact of the selected column and 2) the selected memory cell of the selected column, thereby electrically coupling the corresponding bit line to the contact region of the selected memory cell through said inversion of said any transistors.

28. The memory of claim 25, wherein the first bias arrangement applies a voltage difference between the body region of the selected memory cell and the contact region of the selected memory cell.

29. The memory of claim 25, wherein the first bias arrangement causes a first voltage difference between the gate of the selected memory cell and the contact region of the selected memory cell, and a second voltage difference between the body region of the selected memory cell and the contact region of the selected memory cell, wherein the first voltage difference and the second voltage difference cause sufficient band-to-band tunneling current for said measuring, and the first voltage difference and the second voltage differences fail to change the charge storage state of the selected memory cell.

30. The memory of claim 25, wherein the first bias arrangement causes a first voltage difference of at least about 5 V between the gate of the selected memory cell and the contact region of the selected memory coil, and a second voltage difference less than about 5 V between the body region of the selected memory cell and the contact region of the selected memory cell.

31. The memory of claim 25, wherein the first bias arrangement induces at least a band-to-band current component through the contact region of the selected memory cell.

32. The memory of claim 25, wherein the body region of the selected memory cell is a well in a semiconductor substrate.

33. The memory of claim 25, wherein the logic further performs:
applying a second bias arrangement to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell.

34. The memory of claim 25, wherein the logic further performs:
applying a second bias arrangement to adjust the charge storage state of the selected memory cell by increasing a net positive charge in the charge trapping structure of the selected memory cell, thereby programming the selected memory cell; and
applying a third bias arrangement to adjust the charge storage state of the selected memory cell by increasing a net negative charge in the charge trapping structure of the selected memory cell, thereby erasing the selected memory cell.

35. The memory of claim 25, wherein the logic further performs:
applying a second bias arrangement to adjust the charge storage state or the selected memory cell by increasing a net positive charge in the charge trapping structure of the selected memory cell, thereby erasing the selected memory cell; and
applying a third bias arrangement to adjust the charge storage state of the selected memory cell by increasing a net negative charge in the charge trapping structure of the selected memory cell, thereby programming the selected memory cell.

36. The memory of claim 25, wherein the logic further performs:
applying a second bias arrangement to adjust the charge storage state of the selected memory cell by increasing a not positive charge in the charge trapping structure of the selected memory cell; and
applying a third bias arrangement to adjust the charge storage state of the selected memory cell by increasing a net negative charge in the charge trapping structure of the selected memory cell via electron tunneling from the gate of the selected memory cell.

37. The memory of claim 25, wherein the logic further performs:
applying a second bias arrangement to adjust the charge storage state of the selected memory cell by increasing a net positive charge in the charge trapping structure of the selected memory cell via hole tunneling from the gate of the selected memory cell; and
applying a third bias arrangement to adjust the charge storage state of the selected memory cell by increasing a net negative charge in the charge trapping structure of the selected memory cell.

38. The memory of claim 25, wherein the logic further performs:
applying a second bias arrangement to adjust the charge storage state of the selected memory cell by increasing a net positive charge in the charge trapping structure of the selected memory cell; and
applying a third bias arrangement to adjust the charge storage state or the selected memory cell by increasing a net negative charge in the charge trapping structure of the selected memory cell via electron tunneling from the body region of the selected memory cell.

39. The memory of claim 25, wherein the logic further performs:
applying a second bias arrangement to adjust the charge storage state of the selected memory cell by increasing a net positive charge in the charge trapping structure of the selected memory cell via hole tunneling from the body region of the selected memory cell; and
applying a third bias arrangement to adjust the charge storage state of the selected memory cell by increasing a net negative charge in the charge trapping structure of the selected memory cell.

40. The memory of claim 25, wherein the logic further performs:
applying a second bias arrangement to adjust the charge storage state of the selected memory cell by increasing a net positive charge in the charge trapping structure of the selected memory cell; and
applying a third bias arrangement to adjust the charge storage state or the selected memory cell by increasing a net negative charge in the charge trapping structure of the selected memory cell via hot electrons from the body region of the selected memory cell.

41. The memory of claim 25, wherein the logic further performs:
applying a second bias arrangement to adjust the charge storage state of the selected memory cell by increasing a net positive charge in the charge trapping structure of the selected memory cell via hot holes from the body region of the selected memory cell; and
applying a third bias arrangement to adjust the charge storage state of the selected memory cell by increasing a net negative charge in the charge trapping structure of the selected memory cell.

42. The memory of claim 25, wherein the logic further performs:
applying a second bias arrangement to adjust the charge storage state of the selected memory cell by increasing a net positive charge in the charge trapping structure of the selected memory cell; and
applying a third bias arrangement to adjust the charge storage state of the selected memory cell by increasing a net negative charge in the charge trapping structure of the selected memory cell via band-to-band hot electrons from the contact region of the selected memory cell.

43. The memory of claim 25, wherein the logic further performs:

applying a second bias arrangement to adjust the charge storage state of the selected memory cell by increasing a net positive charge in the charge trapping structure of the selected memory cell via band-to-band hot holes from the contact region of the selected memory cell; and applying a third bias arrangement to adjust the charge storage state of the selected memory cell by increasing a net negative charge in the charge trapping structure of the selected memory cell.

44. The memory of claim 25, wherein the charge storage state of each part of the charge trapping structure of the selected memory cell stores one bit.

45. The memory of claim 25, wherein the charge storage state of each part of the charge trapping structure of the selected memory cell stores multiple bits.

46. The memory of claim 25, wherein hot holes generated during the first bias arrangement are insufficient to disturb the charge storage state of the selected memory cell.

47. The memory of claim 25, wherein hot electrons generated during the first bias arrangement are insufficient to disturb the charge storage state of the selected memory cell.

48. The memory of claim 25, wherein the logic further performs:
   applying a second bias arrangement to adjust the charge storage state of the selected memory cell by increasing a net positive charge in the charge trapping structure of the selected memory cell; and
   applying a third bias arrangement to adjust the charge storage state of the selected memory cell by increasing a net negative charge in the charge trapping structure of the selected memory cell,
   wherein said current is about 100 nA for the charge storage state of the selected memory cell adjusted by one of the second bias arrangement and the third bias arrangement, and said current is about 1 nA for the charge storage state of the selected memory cell adjusted by the other of the second bias arrangement and the third bias arrangement.

49. The memory of claim 25, wherein the logic further performs:
   applying a second bias arrangement to adjust the charge storage state of the selected memory cell by increasing a net positive charge in the charge trapping structure of the selected memory cell; and
   applying a third bias arrangement to adjust the charge storage state of the selected memory cell by increasing a net negative charge in the charge trapping structure of the selected memory cell,
   wherein said current is at least about 10 times greater for the charge storage state of the selected memory cell adjusted by one of the second bias arrangement and the third bias arrangement than said current for the charge storage state of the selected memory cell adjusted by the other of the second bias arrangement and the third bias arrangement.

50. A method of manufacturing nonvolatile memory, comprising:
   providing a semiconductor substrate;
   providing a plurality of bit lines;
   providing a memory array including a plurality of memory cells arranged in rows and columns, each of the columns including memory cells arranged in a series from a contact, each of the columns coupled to a corresponding bit line of the plurality orbit lines at least at the contact, each memory cell including:
      a body region;
      a contact region coupled to the body region;
      a bottom dielectric coupled to the body region;
      a charge trapping structure coupled to the bottom dielectric having a charge storage state; and
      a top dielectric coupled to the charge trapping structure;
   providing a plurality of word lines coupled to the top dielectrics of the plurality of memory cells, each word line of the plurality of word lines providing voltage as a gate for memory cells coupled to said each word line; and
   providing logic coupled to the plurality of bit lines and the plurality of word lines, the logic applying a first bias arrangement to determine the charge storage state of the charge trapping structure of at least a selected memory cell, and the logic measuring current flowing in response to the first biasing arrangement to determine the charge storage state of the charge trapping structure of the selected memory cell, the current flowing between the body region of the selected memory cell and the contact region of the selected memory cell.

* * * * *

UNITED STATES PATENT AND TRADEMARK OFFICE
CERTIFICATE OF CORRECTION

PATENT NO. : 7,072,220 B1 Page 1 of 2
APPLICATION NO. : 11/024075
DATED : July 4, 2006
INVENTOR(S) : Chih Chieh Yeh It is certified that error appears in the above-identified patent and that said Letters Patent is hereby corrected as shown below:

In the drawings, Sheet 16, Figure 13, below the reference numeral 1302, after the equation portion "V BODY =", delete "-10 V" and insert -- 0 V --. see attached In Column 8, line 18, delete "Fig. 1A" and Insert -- Fig. 1B --

In Column 8, line 21, delete "Fig. 1B" arid insert -- Fig. 1A --.

In Column 13, line 29, delete "-10 V" and insert -- 0 V --.

Signed and Sealed this

Fifth Day of December, 2006

JON W. DUDAS
*Director of the United States Patent and Trademark Office*